(12) United States Patent
Tada et al.

(10) Patent No.: US 12,721,162 B2
(45) Date of Patent: Aug. 25, 2026

(54) POWER SEMICONDUCTOR DEVICE, METHOD FOR MANUFACTURING SAME, AND POWER CONVERSION DEVICE

(71) Applicant: Mitsubishi Electric Corporation, Tokyo (JP)

(72) Inventors: Haruna Tada, Tokyo (JP); Masaki Goto, Tokyo (JP); Hodaka Rokubuichi, Tokyo (JP); Hayato Terada, Tokyo (JP); Yasuyuki Sanda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 435 days.

(21) Appl. No.: 18/566,882

(22) PCT Filed: Jun. 14, 2022

(86) PCT No.: PCT/JP2022/023763
§ 371 (c)(1),
(2) Date: Dec. 4, 2023

(87) PCT Pub. No.: WO2022/265003
PCT Pub. Date: Dec. 22, 2022

(65) Prior Publication Data

US 2024/0274489 A1 Aug. 15, 2024

(30) Foreign Application Priority Data

Jun. 18, 2021 (JP) ................................ 2021-101541

(51) Int. Cl.
*H10W 40/22* (2026.01)
*H02M 7/48* (2007.01)
(Continued)

(52) U.S. Cl.
CPC ........... *H10W 40/226* (2026.01); *H02M 7/48* (2013.01); *H10W 40/037* (2026.01);
(Continued)

(58) Field of Classification Search
CPC .................................................. H10W 40/037
See application file for complete search history.

(56) References Cited

U.S. PATENT DOCUMENTS 8,643,171 B1 2/2014 Nakazato et al.
9,554,458 B2 1/2017 Knörr et al.
(Continued)

FOREIGN PATENT DOCUMENTS

DE 102010061044 A1 * 6/2012 ............ H10W 40/22
JP H06005750 A 1/1994
(Continued)

OTHER PUBLICATIONS

International Search Report (PCT/ISA/210) with translation and Written Opinion (PCT/ISA/237) mailed on Mar. 29, 2022, by the Japan Patent Office as the International Searching Authority for International Application No. PCT/JP2022/001154. (8 pages).
(Continued)

*Primary Examiner* — Erik Kielin
(74) *Attorney, Agent, or Firm* — Buchanan Ingersoll & Rooney PC

(57) ABSTRACT

A power semiconductor device includes a power module part and a heat sink. An uneven part is formed in a module base in the power module part. The uneven part includes a recess and a buffer recess. The buffer recess is formed in a direction that crosses a direction in which the recess extends. An uneven part is formed on a heat sink base part in the heat sink. The uneven part and the uneven part are fitted together by a crimping process to integrate the module base of the
(Continued)

power module part and a heat radiation diffusion part of the heat sink. The buffer recess is left as a space.

18 Claims, 28 Drawing Sheets

(51) Int. Cl.

| | |
|---|---|
| ***H10W 40/00*** | (2026.01) |
| ***H10W 70/02*** | (2026.01) |
| ***H10W 74/10*** | (2026.01) |
| ***H10W 90/00*** | (2026.01) |

(52) U.S. Cl.

CPC ....... *H10W 70/027* (2026.01); *H10W 74/127* (2026.01); *H10W 74/10* (2026.01); *H10W 90/00* (2026.01); *H10W 90/734* (2026.01)

(56) References Cited

U.S. PATENT DOCUMENTS

| | | | |
|---|---|---|---|
| 10,297,524 | B2 | 5/2019 | Watanabe et al. |
| 2002/0070005 | A1 | 6/2002 | Kawabata et al. |
| 2007/0035008 | A1 | 2/2007 | Wu et al. |
| 2012/0227952 | A1 | 9/2012 | Yoshihara et al. |
| 2014/0035122 | A1 | 2/2014 | Nakazato et al. |
| 2014/0367702 | A1 | 12/2014 | Yamamoto et al. |
| 2016/0225691 | A1 | 8/2016 | Sanda et al. |
| 2016/0282057 | A1* | 9/2016 | Hongo .................... F28D 20/02 |
| 2016/0300785 | A1 | 10/2016 | Kimura et al. |
| 2019/0295919 | A1 | 9/2019 | Sanda et al. |
| 2020/0043824 | A1 | 2/2020 | Tada et al. |
| 2022/0077033 | A1 | 3/2022 | Tsukiyama et al. |

FOREIGN PATENT DOCUMENTS

| | | | | |
|---|---|---|---|---|
| JP | 2011155118 | A | 8/2011 | |
| JP | 5236127 | B1 | 7/2013 | |
| JP | 2013165122 | A | 8/2013 | |
| JP | 5418601 | B2 | 11/2013 | |
| JP | 5373688 | B2 | 12/2013 | |
| JP | 5432085 | B2 | 12/2013 | |
| JP | 6009209 | B2 | 10/2016 | |
| JP | 6091633 | B2 | 3/2017 | |
| WO | 2018079396 | A1 | 5/2018 | |
| WO | 2018097027 | A1 | 5/2018 | |
| WO | 2020261730 | A1 | 12/2020 | |
| WO | WO-2022218906 | A1 * | 10/2022 | ............ H10W 40/47 |

OTHER PUBLICATIONS

International Search Report (PCT/ISA/210) with translation and Written Opinion (PCT/ISA/237) mailed on Sep. 6, 2022, by the Japan Patent Office as the International Searching Authority for International Application No. PCT/JP2022/023763. (8 pages).

* cited by examiner

PRESENCE OF BUFFER RECESS
BEFORE HEAT SINK CRIMPING
AFTER HEAT SINK CRIMPING AT 1 AkN
Z
X
Y
13
15,15c
15,15c
55,55a
55f
53
15,15a
16
16
15,15c
15,15c
55,55a
53

REMAINDER OF HEAT SINK CRIMPING INSERTION DEPTH
RELATIONSHIP BETWEEN PRESS LOAD AND REMAINDER OF HEAT SINK INSERTION DEPTH
13(15,15a,15b,15c,15d)
15f
RD
53,53a(55,55a,55b)
55f
Z
X
REMAINDER OF HEAT SINK CRIMPING INSERTION DEPTH RD[mm]
0.70
0.60
0.50
0.40
0.30
0.20
0.10
0.00
EMBODIMENT
COMPARATIVE EXAMPLE
A
2A
3A
4A
PRESS LOAD [kN]

HEAT SINK BASE PART BEFORE HEAT SINK CRIMPING
MODULE BASE BEFORE HEAT SINK CRIMPING
HEAT-SINK-INTEGRATED POWER MODULE (LONG SIDE) AFTER HEAT SINK CRIMPING
HEAT-SINK-INTEGRATED POWER MODULE (SHORT SIDE) AFTER HEAT SINK CRIMPING
53
55f
55,55a
13
15f
15,15a
15,15c
1
11
21
23
25
27
29
51
51,53
X
Y
Z 1
23
29
23
25
27
21
11
17,17c
13
17,17a
17f
57,57a
57f
61
53,53a
51,
51a
Z
X
Y
63

1
23
29
23
25
27
21
11
13
17,17a
17f
17,17c
57f
57,57a
53,53a
61
51,
51a
Z
Y
X
63

Z
Y
X
13
15f
15,15a
15,15a
15,15a
15,15a
15,15a
15,15a
15,15a
15,15a
15,15c
15,15c
15,15c
15,15c 53,53a
Y
X
Z
63

1
23
29
23
25
27
15f
21
11
15,15c
13
15,15a
55,55a
55f
65
61
51,
51a
73
Z
X
Y
63
53,53a 1
23
29
23
25
27
15f
21
15,15c
11
15,15a
13
55,55a
61
53,53a
55f
51,
51a
Z
X
Y
63

1
23
29
23
25
27
21
11
15,15c
13
15,15a
15f
55,55a
55f
65
51,
51b
73
63
53,53a
Z
X
Y 1
23
29
23
25
27
15f
21
15,15c
15,15a
55,55a
11
13
53,53a
55f
51,
51b
63
Z
X
Y

POWER SEMICONDUCTOR DEVICE, METHOD FOR MANUFACTURING SAME, AND POWER CONVERSION DEVICE

TECHNICAL FIELD

The present disclosure relates to a power semiconductor device, a method for manufacturing the same, and a power conversion device.

BACKGROUND ART

As an example of a power semiconductor device including a power semiconductor element, a heat-sink-integrated power semiconductor module has been proposed in which a power module part equipped with a power semiconductor element and a heat sink are integrated (PTL 1 to PTL 10).

CITATION LIST

Patent Literature

PTL 1: Japanese Patent No. 5236127
PTL 2: Japanese Patent No. 5373688
PTL 3: Japanese Patent No. 5418601
PTL 4: Japanese Patent No. 5432085
PTL 5: Japanese Patent No. 6009209
PTL 6: Japanese Patent No. 6091633
PTL 7: Japanese Patent Laying-Open No. 06-5750
PTL 8: Japanese Patent Laying-Open No. 2011-155118
PTL 9: WO 2018-079396
PTL 10: WO 2018-097027

SUMMARY OF INVENTION

Technical Problem

A heat-sink-integrated power semiconductor module serving as a power semiconductor device has been requested to have further increased productivity with respect to the integration of a power module part and a heat sink.

The present disclosure has been devised as part of such development. An object of the present disclosure is to provide a power semiconductor device that is allowed to have further increased productivity. Another object of the present disclosure is to provide a method for manufacturing such a power semiconductor device. Yet another object of the present disclosure is to provide a power conversion device to which such a power semiconductor device is applied.

Solution to Problem

A power semiconductor device according to the present disclosure includes a power module part: a heat sink base part; and a plurality of heat radiator fins. The power module part includes a module base on which a first uneven part is formed. The module base is equipped with a power semiconductor element. The power semiconductor element is sealed with a sealant. A second uneven part is formed on the heat sink base part. The heat sink base part is joined to the module base in a manner in which the second uneven part and the first uneven part are fitted together. The plurality of heat radiator fins is each attached to the heat sink base part. On the module base and the heat sink base part, the first uneven part and the second uneven part have a portion at which the first uneven part and the second uneven part are fitted together. The portion extends in a first direction. Any of the first uneven part and the second uneven part includes a buffer recess that is left as a space with the module base and the heat sink base part joined together. The buffer recess is formed to extend in a second direction that crosses the first direction.

A method for manufacturing a power semiconductor device according to the present disclosure includes the following steps. A module base on which a first uneven part is formed is prepared. A power module part is formed by mounting a power semiconductor element on the module base with and sealing the power semiconductor element with a sealant in a manner in which the first uneven part is exposed. A heat sink base part on which a second uneven part is formed is prepared. The second uneven part is fitted into the first uneven part. The module base and the heat sink base part are integrated by opposing the first uneven part and the second uneven part to each other and pressing one of the module base in the power module part and the heat sink base part to another of the module base in the power module part and the heat sink base part. In the preparing the module base and the preparing the heat sink base part, the first uneven part and the second uneven part are formed to have a portion at which the first uneven part and the second uneven part are fitted together. The portion extends in a first direction. A buffer recess is formed in any of the first uneven part and the second uneven part to extend in a second direction that crosses the first direction. The buffer recess is left as a space with the module base and the heat sink base part joined together.

A power conversion device according to the present disclosure includes: a main conversion circuit including the power semiconductor device; and a control circuit that outputs a control signal to the main conversion circuit. The main conversion circuit converts and outputs received power. The control signal is for controlling the main conversion circuit.

Advantageous Effects of Invention

According to a power semiconductor device according to the present disclosure, a module base and a heat sink base part are formed in a manner in which any of a first uneven part and a second uneven part includes a buffer recess that is left as a space with the module base and the heat sink base part joined together. The buffer recess is formed at a portion at which the first uneven part and the second uneven part are fitted together. The buffer recess is formed to extend in a second direction. The portion extends in a first direction. The second direction crosses the first direction. This makes it possible to reduce a load for integrating the module base and the heat sink base part. As a result, the power semiconductor device is obtained that is allowed to have increased productivity.

According to a method for manufacturing the power semiconductor device according to the present disclosure, in the preparing the module base and the preparing the heat sink base part, the first uneven part and the second uneven part are formed to have a portion at which the first uneven part and the second uneven part are fitted together. The portion extends in a first direction. A buffer recess is formed in any of the first uneven part and the second uneven part to extend in a second direction that crosses the first direction. The buffer recess is left as a space with the module base and the heat sink base part joined together. This makes it possible to reduce a load for integrating the module base and the heat sink base part. As a result, it is possible to increase the productivity of the power semiconductor device.

A power conversion device according to the present disclosure includes the power semiconductor device described above. This makes it possible to obtain the power conversion device that is allowed to have increased productivity.

DESCRIPTION OF EMBODIMENTS

A power semiconductor device according to each of embodiments is a heat-sink-integrated power semiconductor module. In the heat-sink-integrated power semiconductor module, a power module part and a heat sink are integrated by a crimping process. To describe the structure of the power semiconductor device, a description will be given by using an X axis, a Y axis, and a Z axis as necessary.

First Embodiment

Figure 1:
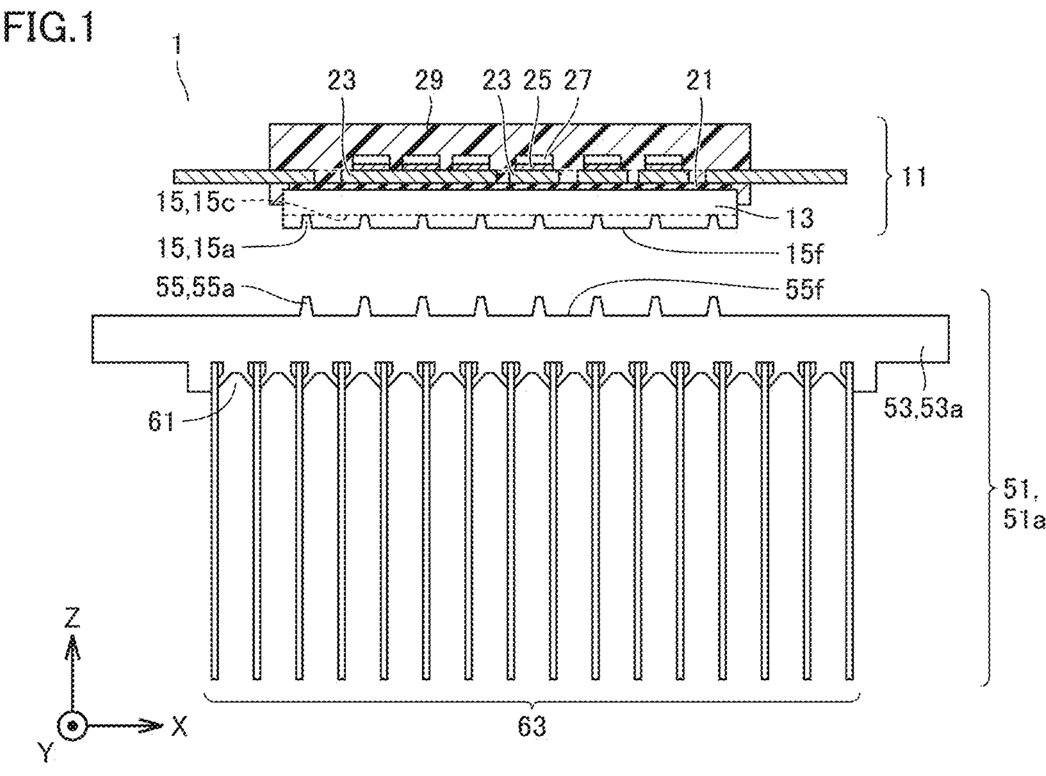
FIG. 1 is a first exploded side view illustrating a power semiconductor device according to a first embodiment, the first exploded side view including a partial cross section.
Figure 2:
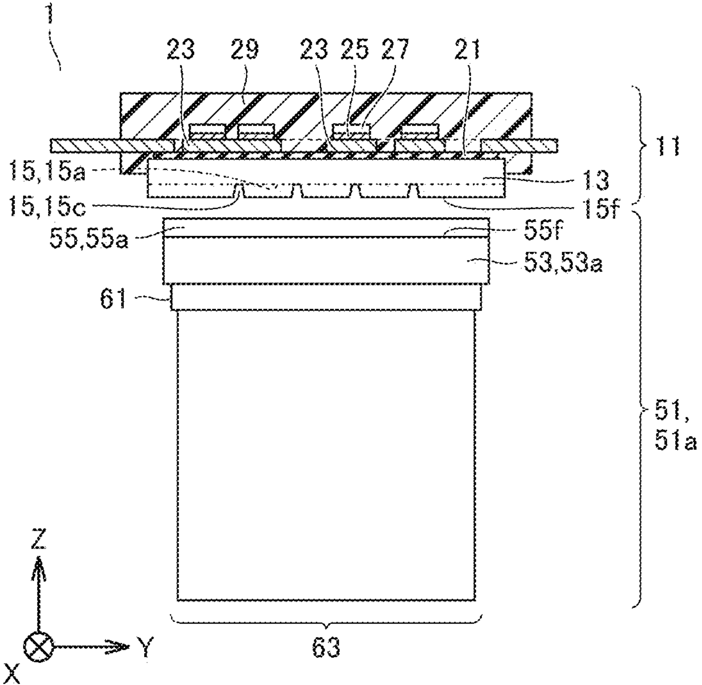
FIG. 2 is a second exploded side view illustrating the power semiconductor device in the first embodiment, the second exploded side view including a partial cross section.

An example of a power semiconductor device according to a first embodiment will be described. FIG. 1 illustrates a first exploded side view including a partial cross section of a power semiconductor device 1 in which a power module part 11 and a heat sink 51 have not yet been integrated by a crimping process. FIG. 2 illustrates a second exploded side view including a partial cross section of power semiconductor device 1 in which power module part 11 and heat sink 51 have not yet been integrated by a crimping process.

Figure 3:
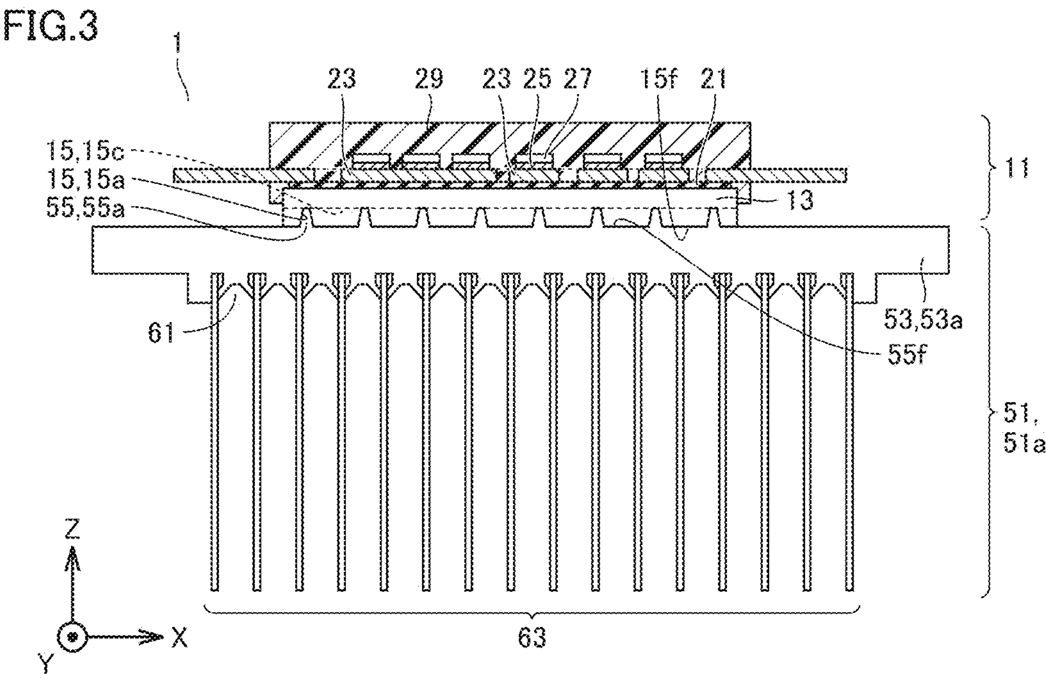
FIG. 3 is a first side view illustrating a power module part and a heat sink that are integrated in the first embodiment, the first side view including a partial cross section.
Figure 4:
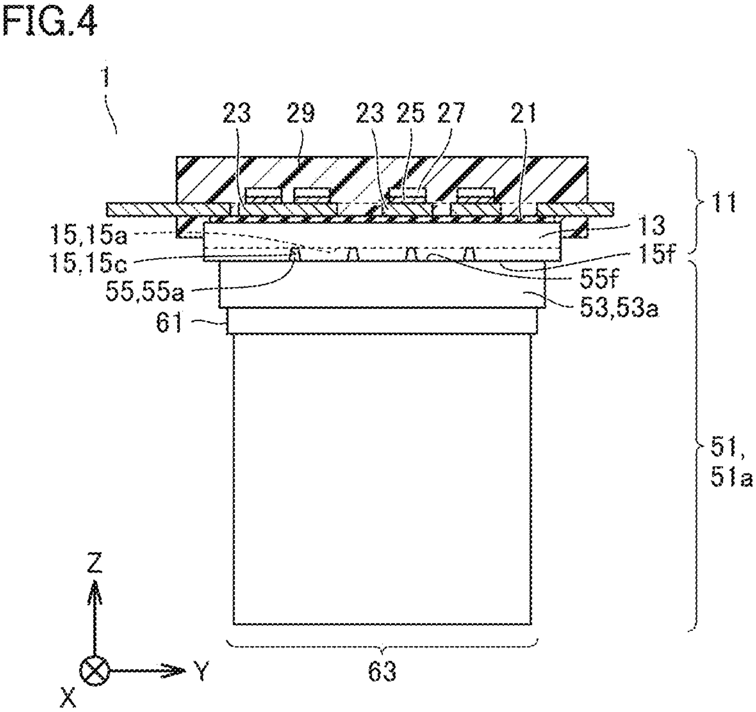
FIG. 4 is a second side view illustrating the power module part and the heat sink that are integrated in the first embodiment, the second side view including a partial cross section.

FIG. 3 illustrates a first side view including a partial cross section of power semiconductor device 1 in which power module part 11 and heat sink 51 have been integrated by a crimping process. FIG. 4 illustrates a second side view including a partial cross section of power semiconductor device 1 in which power module part 11 and heat sink 51 have been integrated by a crimping process.

As illustrated in FIGS. 1, 2, 3, and 4, power semiconductor device 1 includes power module part 11 and heat sink 51. An uneven part 15 serving as a first uneven part is formed on power module part 11. An uneven part 55 serving as a second uneven part is formed on heat sink 51.

Power module part 11 includes a module base 13. A lead frame 23 is disposed above one of the surfaces of module base 13 with an insulating sheet 21 interposed in between. A chip 27 is joined to lead frame 23 with a solder 25. A power semiconductor element is formed on chip 27. Chip 27 and the like are sealed with a mold resin 29 serving as a sealant. A portion of lead frame 23 projects from a side surface of mold resin 29 as an external terminal.

Uneven part 15 is formed on the other surface of module base 13. Uneven part 15 has an uneven shape in which a recess 15*a* and the like are formed in a flat part 15*f*. Uneven part 15 includes recess 15*a* and a buffer recess 15*c*. In this power semiconductor device 1, module base 13 is formed in a manner in which uneven part 15 includes buffer recess 15*c*. Recess 15*a* extends in a Y-axis direction serving as a first direction. Buffer recess 15*c* extends in an X-axis direction serving as a second direction. It is to be noted that it is sufficient if buffer recess 15*c* is formed in a direction that crosses the direction in which recess 15*a* extends in addition to the direction that is substantially orthogonal to the direction in which recess 15*a* extends.

Heat sink 51 includes a heat sink base part 53 and heat radiator fins 63. Heat sink base part 53 includes a heat radiation diffusion part 53*a*. Here, a heat sink 51*a* is adopted that has a crimped structure in which heat radiator fins 63 and heat sink base part 53 are integrated as heat sink base part 53 by a crimping process. Uneven part 55 is formed on heat sink base part 53 (heat radiation diffusion part 53*a*). Uneven part 55 has an uneven shape in which a protrusion 55*a* is formed in a flat part 55*f*. Heat radiator fins 63 are disposed on the opposed side of heat sink base part 53 to the side on which uneven part 55 is formed. Heat radiator fins 63 are disposed substantially parallel to a Y-Z plane. Heat radiator fins 63 are disposed in the X-axis direction with an interval in between.

As illustrated in FIGS. 3 and 4, uneven part 15 formed on power module part 11 and uneven part 55 formed on heat sink 51 are fitted together by a crimping process in power semiconductor device 1. This joins and integrates power module part 11 and heat sink 51.

Specifically, power module part 11 and heat sink base part 53 are integrated in a manner in which uneven part 15 and uneven part 55 include a portion at which uneven part 15 and uneven part 55 are fitted together and uneven part 15 and uneven part 55 also include a portion at which uneven part 15 and uneven part 55 are not fitted together. As the portion at which uneven part 15 and uneven part 55 are not fitted together, uneven part 15 of power module part 11 includes buffer recess 15*c* in this power semiconductor device 1 as illustrated in FIG. 4. Protrusion 55*a* is not fitted into buffer recess 15*c*. Buffer recess 15*c* is left as a space with power module part 11 and heat sink base part 53 joined together.

Module base 13 is fabricated, for example, by a cutting process, a die casting process, a forging process, an extruding process, or the like. Module base 13 is formed by using, for example, aluminum, aluminum alloy, or the like. Heat sink base part 53 is formed by a cutting process, a die casting process, a forging process, an extruding process, or the like. Heat sink base part 53 is formed by using, for example, aluminum, aluminum alloy, or the like. Power semiconductor device 1 according to the first embodiment is configured as described above.

Next, an example of a method for manufacturing power semiconductor device 1 described above will be described.

Figure 5:
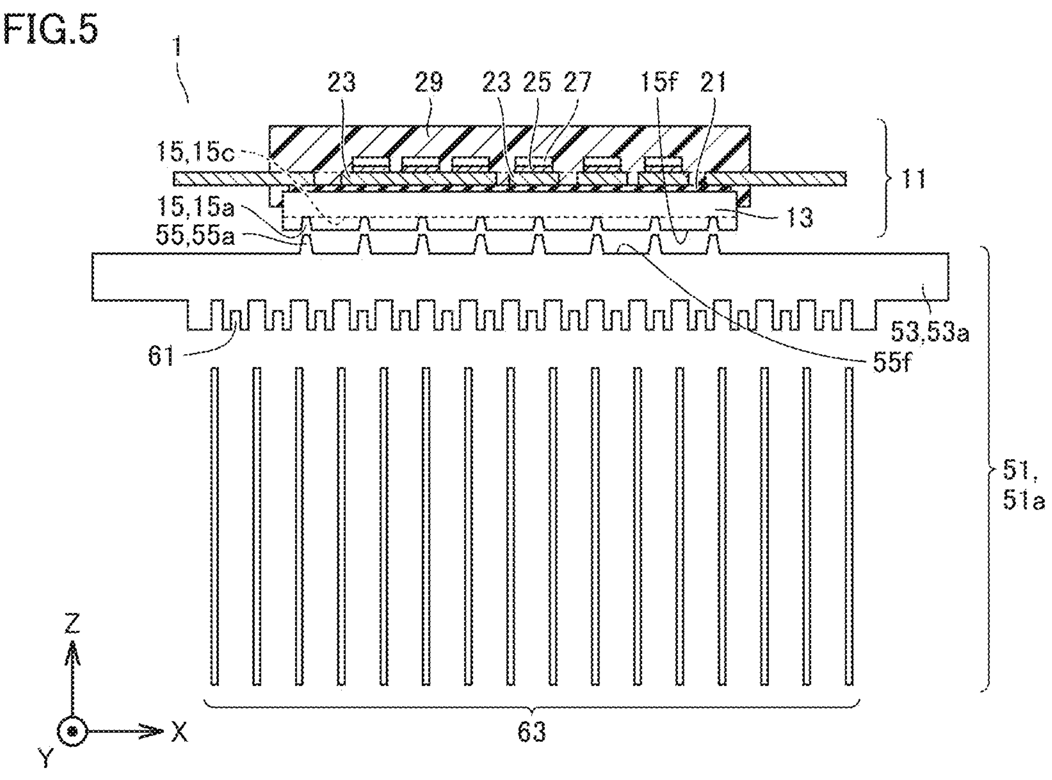
FIG. 5 is a side view including a partial cross section, the side view illustrating a step of a method for manufacturing the power semiconductor device in the first embodiment.

First, module base 13 on which uneven part 15 including recess 15*a* and buffer recess 15*c* is formed is prepared (see FIG. 5). Chip 27 on which the power semiconductor element is formed is mounted on module base 13 and sealed with mold resin 29 to form power module part 11 (see FIG. 5). In addition, heat sink 51*a* (51) on which uneven part 55 and a crimp part 61 are formed is prepared (see FIG. 5). Further, plurality of plate-shaped heat radiator fins 63 is prepared (see FIG. 5).

Next, as illustrated in FIG. 5, power module part 11 and heat sink base part 53 are disposed to cause uneven part 15 formed on module base 13 of power module part 11 and uneven part 55 formed on heat sink base part 53 to be opposed to each other. In addition, plurality of heat radiator fins 63 is each disposed at a position opposed to crimp part 61 formed on heat sink base part 53.

Figure 6:
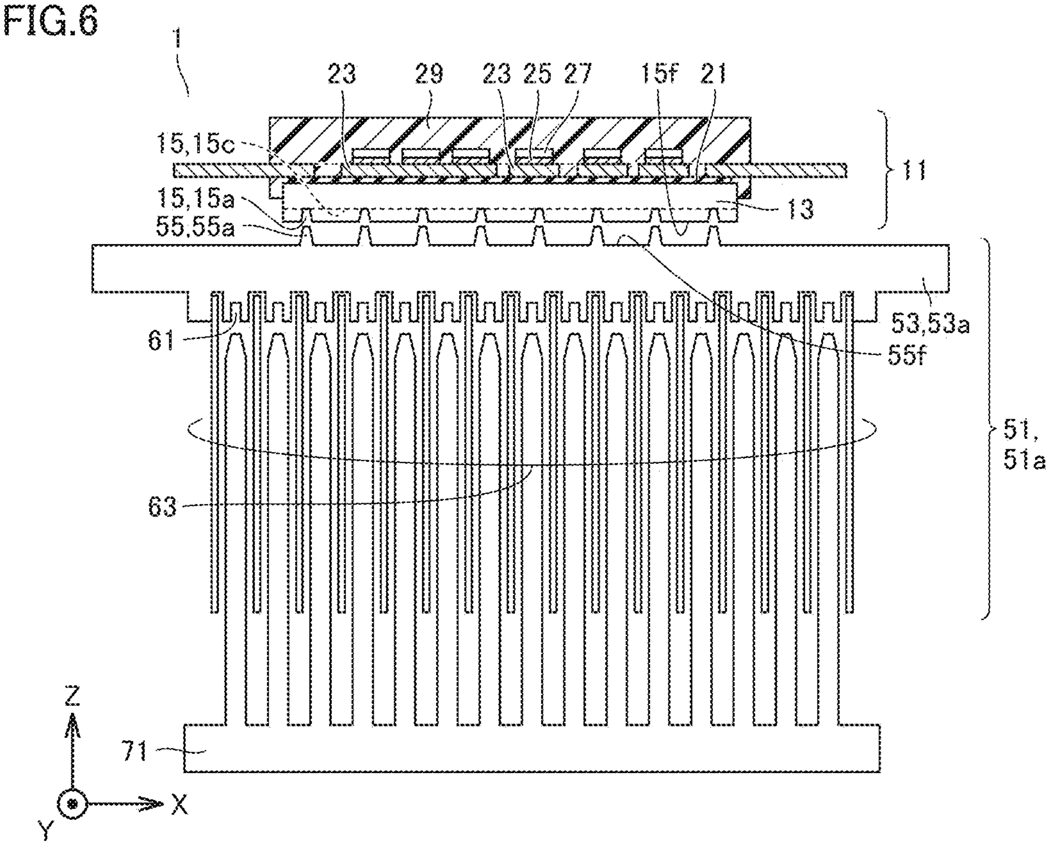
FIG. 6 is a side view including a partial cross section, the side view illustrating a step to be performed after the step illustrated in FIG. 5 in the first embodiment.

Next, as illustrated in FIG. 6, plurality of heat radiator fins 63 is each inserted in the corresponding groove (fin insertion groove) positioned between crimp part 61 and crimp part 61 that are adjacent to each other. A press blade 71 serving as a crimping jig (processing tool) is inserted into crimp parts 61.

Figure 7:
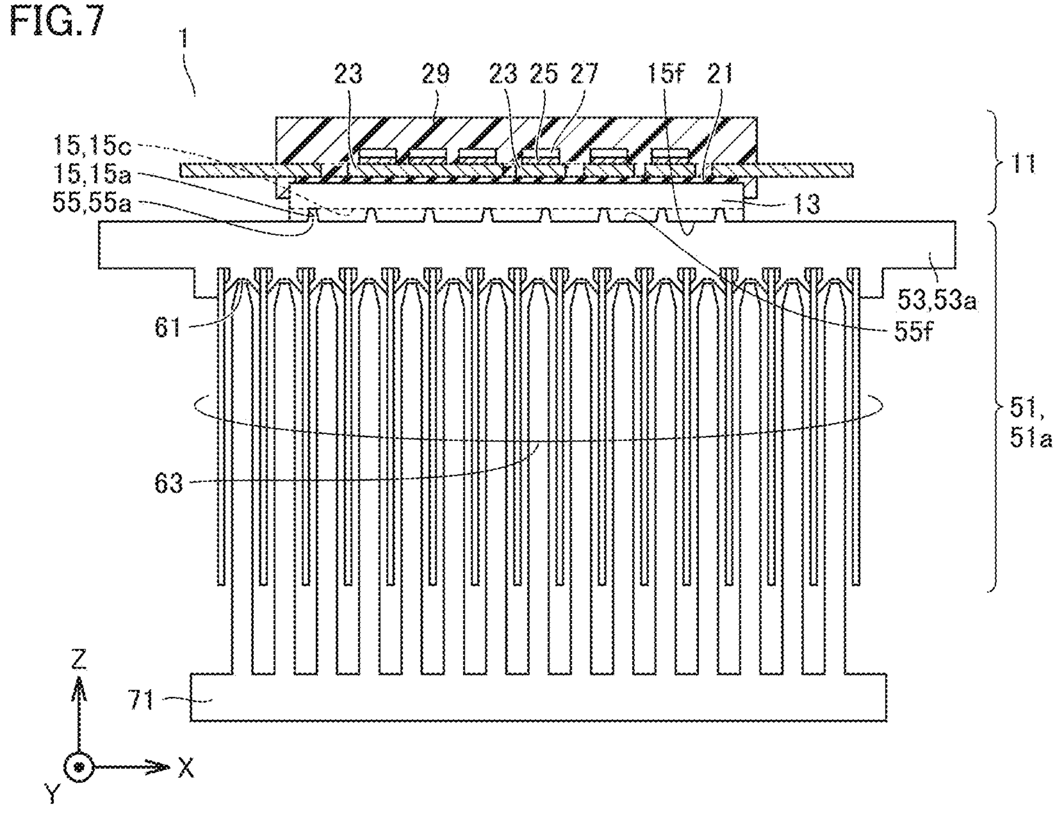
FIG. 7 is a side view including a partial cross section, the side view illustrating a step to be performed after the step illustrated in FIG. 6 in the first embodiment.

Next, as illustrated in FIG. 7, press blade 71 is brought into contact with crimp parts 61. Power module part 11 is pressed down in that state to fit uneven part 15 of module base 13 (power module part 11) and uneven part 55 of heat sink base part 53 together and join power module part 11 to heat sink base part 53.

In addition, press blade 71 crimps crimp parts 61 to join plurality of heat radiator fins 63 to heat sink base part 53. After that, press blade 71 is detached to complete power semiconductor device 1 illustrated in FIGS. 3 and 4 in which power module part 11 and heat sink 51 are integrated.

In power semiconductor device 1 described above, buffer recess 15*c* is formed on module base 13. Protrusion 55*a* in uneven part 55 formed on heat sink base part 53 is not fitted into buffer recess 15*c*. Buffer recess 15*c* is left as a space with power module part 11 and heat sink base part 53 joined together. This makes it possible to reduce a load for joining module base 13 and heat sink base part 53. This will be described by using schematic diagrams.

Figure 8:
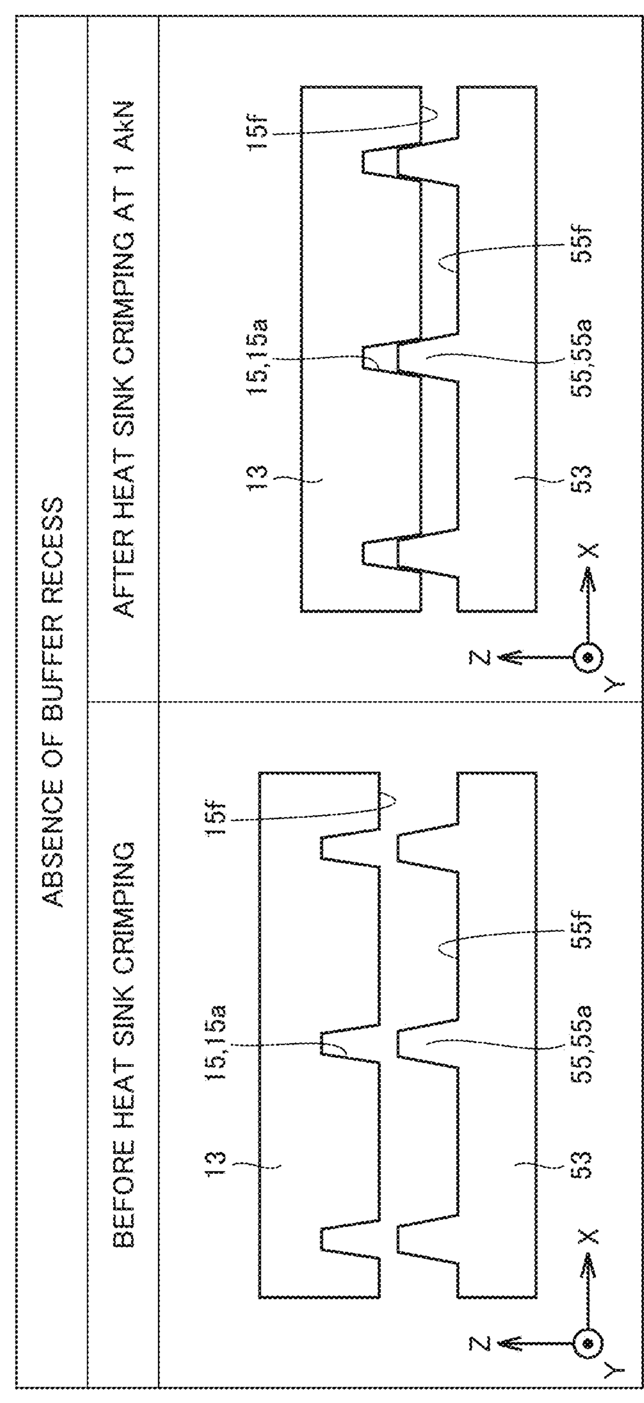
FIG. 8 is a first diagram for describing workings and effects of the power semiconductor device in the first embodiment.
Figure 9:
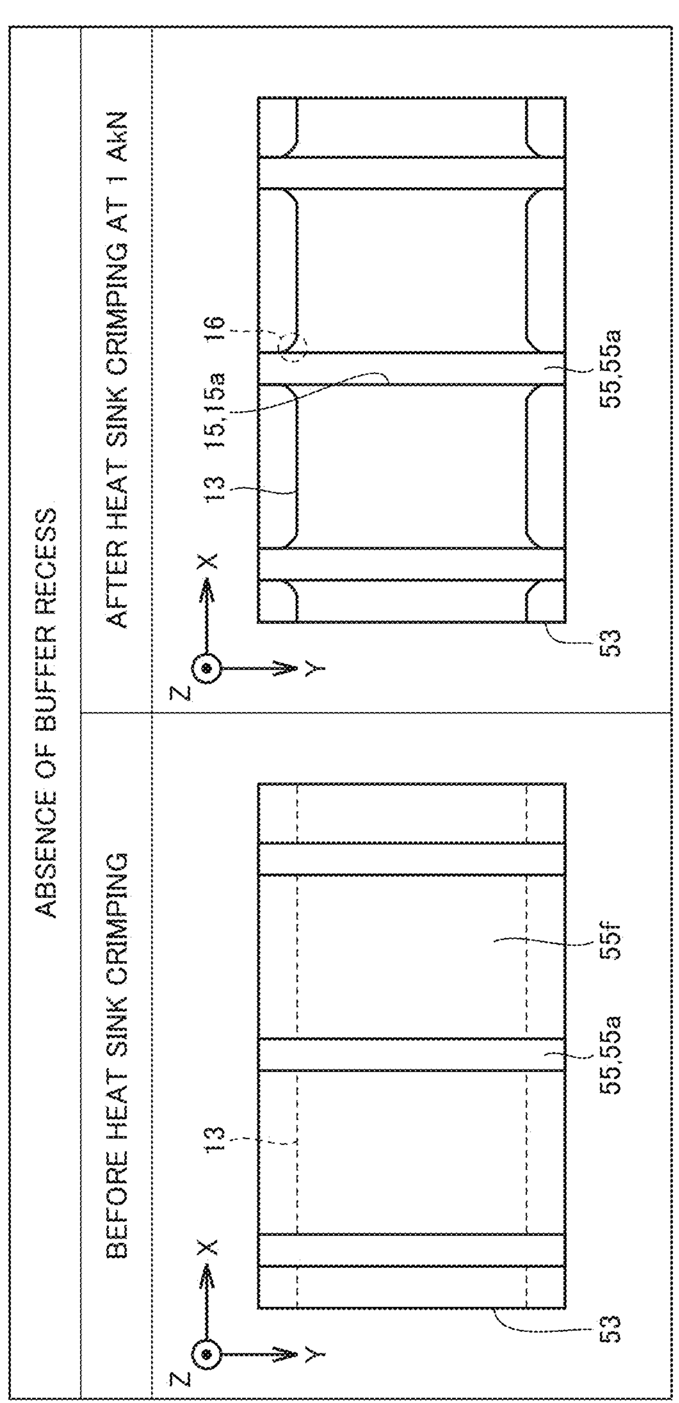
FIG. 9 is a second diagram for describing the workings and effects of the power semiconductor device in the first embodiment.

First, each of FIGS. 8 and 9 schematically illustrates, for comparison, a state in which module base 13 and heat sink base part 53 have not yet been fitted (before heat sink crimping) and a state in which module base 13 and heat sink base part 53 have been fitted (after heat sink crimping) in the case of module base 13 on which no buffer recess is formed.

Figure 10:
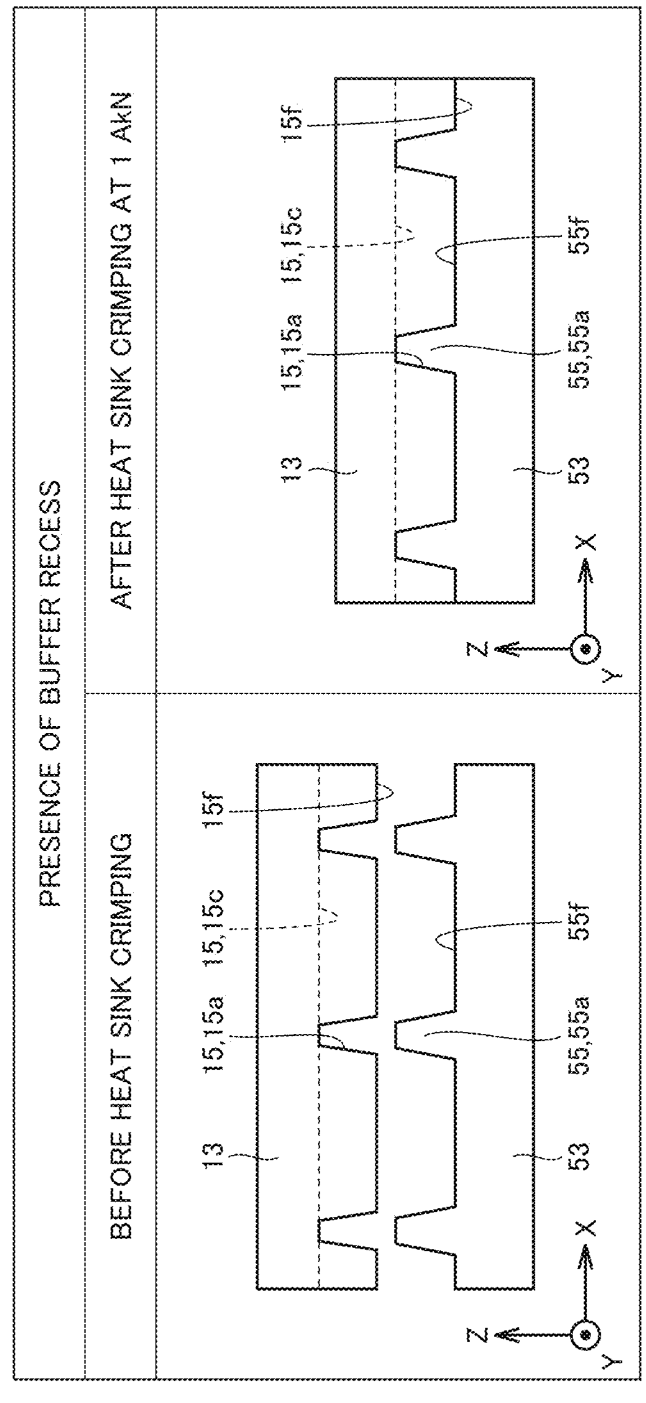
FIG. 10 is a third diagram for describing the workings and effects of the power semiconductor device in the first embodiment.
Figure 11:
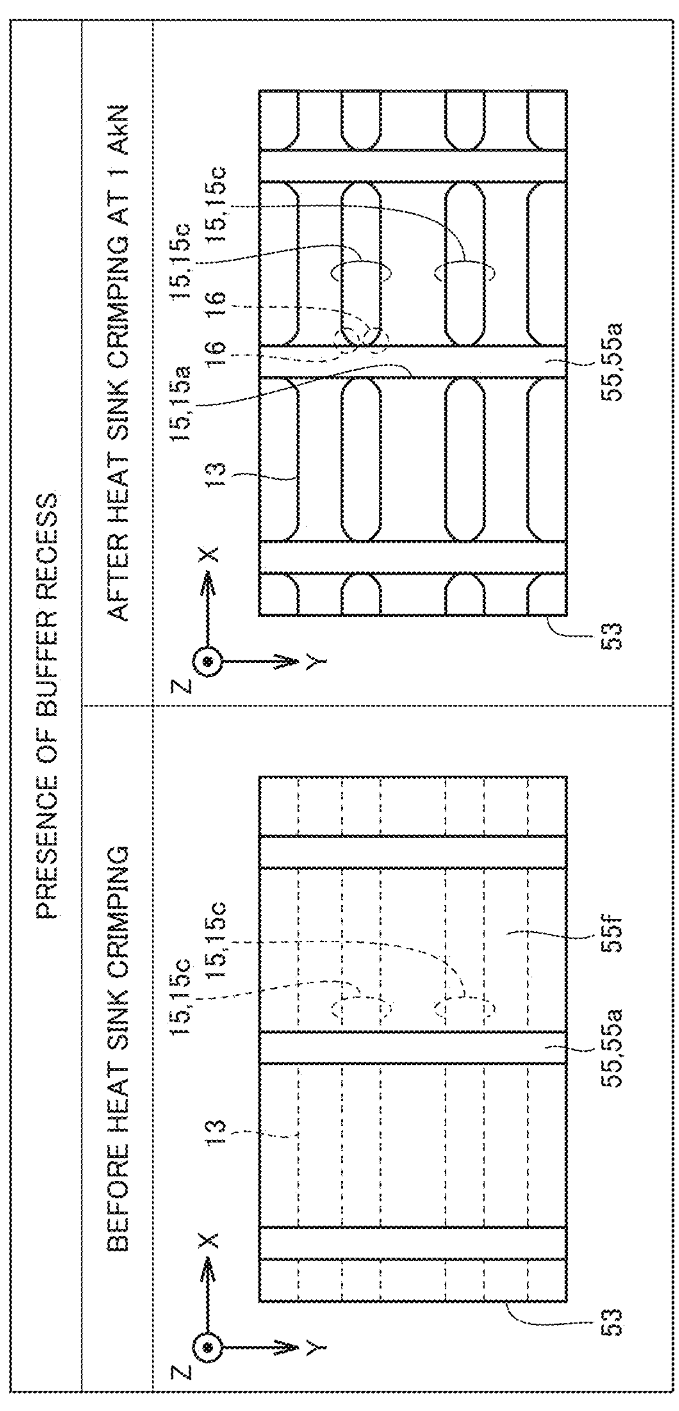
FIG. 11 is a fourth diagram for describing the workings and effects of the power semiconductor device in the first embodiment.

In contrast, each of FIGS. 10 and 11 schematically illustrates a state in which module base 13 and heat sink base part 53 have not yet been fitted (before heat sink crimping) and a state in which module base 13 and heat sink base part 53 have been fitted (after heat sink crimping) in the case of module base 13 according to the first embodiment on which buffer recess 15*c* is formed. It is to be noted that a reference load is imparted as a press load in any case to fit module base 13 and heat sink base part 53. This reference load is described as "1 AkN".

As illustrated in FIGS. 8 and 9, in the case of module base 13 on which no buffer recess is formed, even the application of a reference load of 1 AkN leaves distance between flat part 15*f* in module base 13 and flat part 55*f* in heat sink base part 53. Heat sink crimping has not yet been completed. Here, the completion of heat sink crimping means a state in which even an increase in the press load does not change the gap between module base 13 and heat sink base part 53.

In contrast, as illustrated in FIGS. 10 and 11, in the case of module base 13 in which buffer recess 15*c* is formed, the application of a reference load of 1 AkN plastically deforms a portion of module base 13 positioned around buffer recess 15*c* as illustrated in a dotted circle 16. Flat part 15*f* in module base 13 and flat part 55*f* in heat sink base part 53 thus come into contact. Even an increase in the press load does not change the gap between module base 13 and heat sink base part 53, completing heat sink crimping.

It is to be noted that protrusion 55*a* is fitted into recess 15*a* to plastically deform a portion of module base 13 positioned around recess 15*a* on the outer peripheral part of module base 13 in both the case of module base 13 on which no buffer recess is formed and the case of module base 13 on which a buffer recess is formed (see dotted circle 16).

In this way, power semiconductor device 1 according to the first embodiment is provided with buffer recess 15*c* on module base 13. This makes it possible to reduce a press load applied to complete heat sink crimping.

In addition, the plastic deformation of a portion of module base 13 positioned around buffer recess 15*c* develops tolerance to relative misalignment between module base 13 and heat sink base part 53 (heat sink 51) as compared with the case where buffer recess 15*c* is not provided.

This makes it possible to relax the precision of aligning module base 13 and heat sink base part 53 (heat sink 51) in heat sink crimping. It is possible to use a simpler alignment jig as the alignment jig. This makes it possible to achieve heat sink crimping that offers more favorable productivity than that of a power semiconductor device disclosed in each of PTLs 9 and 10 in which an uneven part formed on a module base and an uneven part formed on a heat sink are fitted and integrated.

In addition, buffer recess 15*c* extends in a direction that crosses the direction in which protrusion 55*a* extends, thereby making it possible to attain an anchor effect with respect to both the X-axis direction and the Y-axis direction. This makes it possible to increase the holding strength with respect to external force (shearing stress) acting on power module part 11 and the like from the respective directions.

Figure 12:
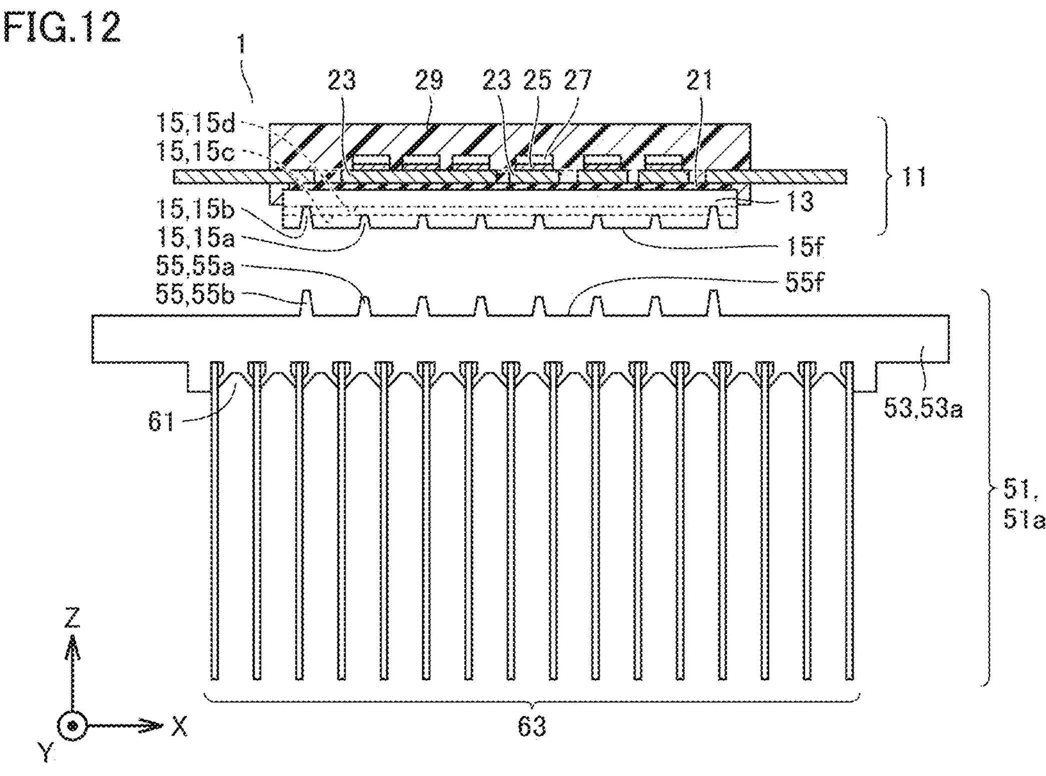
FIG. 12 is a first exploded side view illustrating a first modification example of a structure of an uneven part in the first embodiment, the first exploded side view including a partial cross section.
Figure 13:
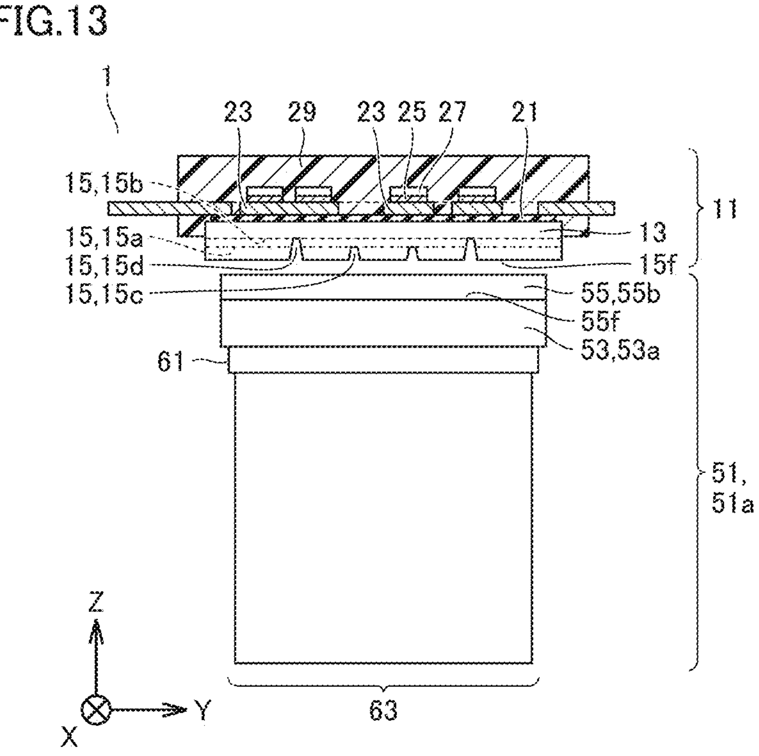
FIG. 13 is a second exploded side view illustrating the first modification example of the structure of the uneven part in the first embodiment, the second exploded side view including a partial cross section.

Further, from the perspective of (to relax) the aligning precision, there may be provided a recess 15*b* having greater depth than the depth of recess 15*a* as uneven part 15 and there may be provided a protrusion 55*b* having greater height than the height of protrusion 55*a* as uneven part 55 as illustrated in FIGS. 12 and 13. It is to be noted that a deeper buffer recess 15*d* corresponding to higher protrusion 55*b* is formed on module base 13 in this case.

Such deeper recess 15*b* and higher protrusion 55*b* are provided to make it possible to roughly align module base 13 with heat sink base part 53 (heat sink 51). In particular, the disposition of higher protrusions 55*b* at the ends (on the positive side and the negative side) in the X-axis direction allows for easier alignment and makes it possible to contribute to an increase in productivity.

The application of a load in that state causes higher protrusions 55*b* to slide on the inclined portions of deeper recesses 15*b* to begin heat sink crimping. In this case, it is possible to further relax the aligning precision with respect to the X-axis direction and use a further simpler alignment jig as the alignment jig. This makes it possible to achieve heat sink crimping that offers further favorable productivity.

The inventors evaluated for an effect of buffer recess 15*c* how much protrusion 55*a* was inserted in recess 15*a* by plastic working analysis (simulation). Next, this evaluation will be described.

Figure 14:
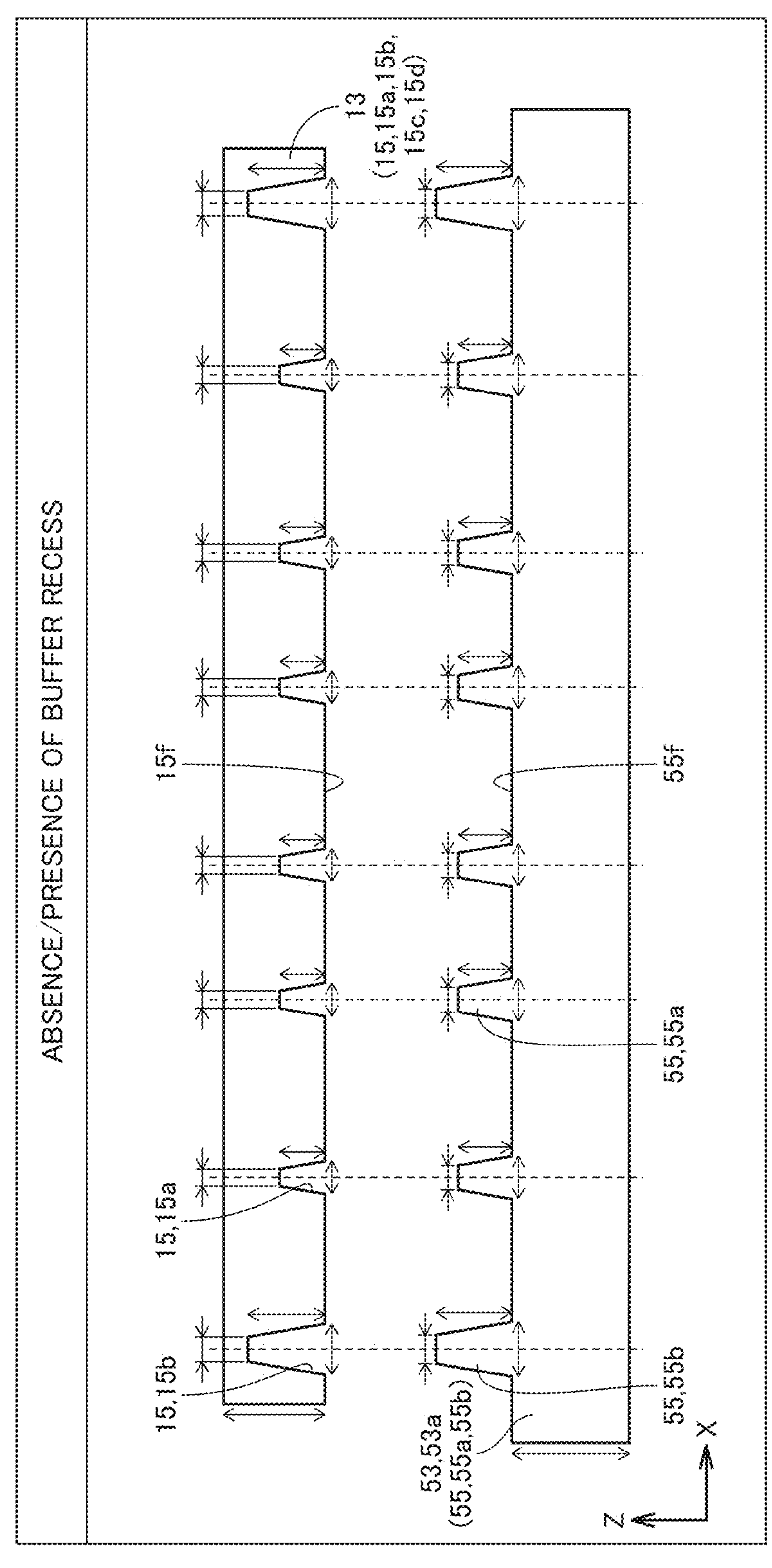
FIG. 14 is a fifth diagram for describing the workings and effects of the power semiconductor device in the first embodiment.

First, respective models of module base 13 and heat sink base part 53 used for the analysis will be described. FIG. 14 illustrates models of module base 13 and heat sink base part 53 parallel to an X-Z plane. This model is common to a model according to a comparative example in which no buffer recess is formed on module base 13 and a model according to the embodiment in which a buffer recess is formed on module base 13.

Figure 15:
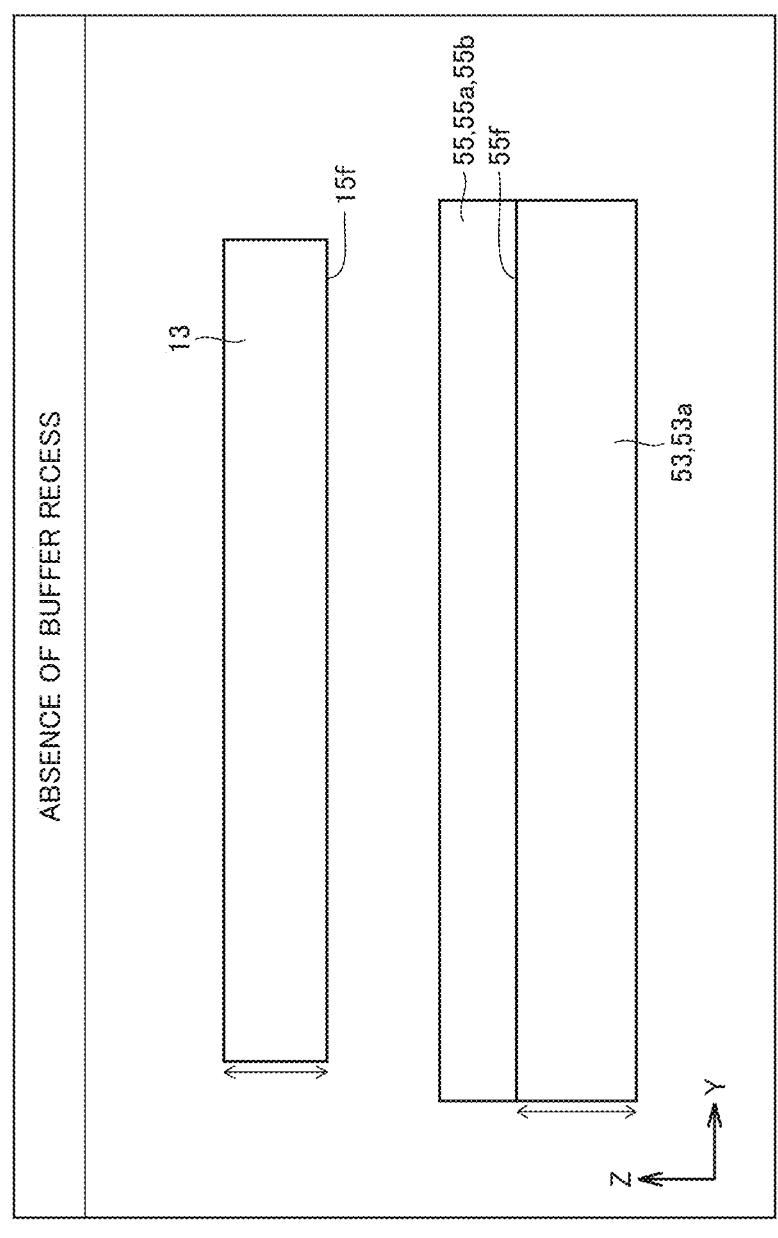
FIG. 15 is a sixth diagram for describing the workings and effects of the power semiconductor device in the first embodiment.
Figure 16:
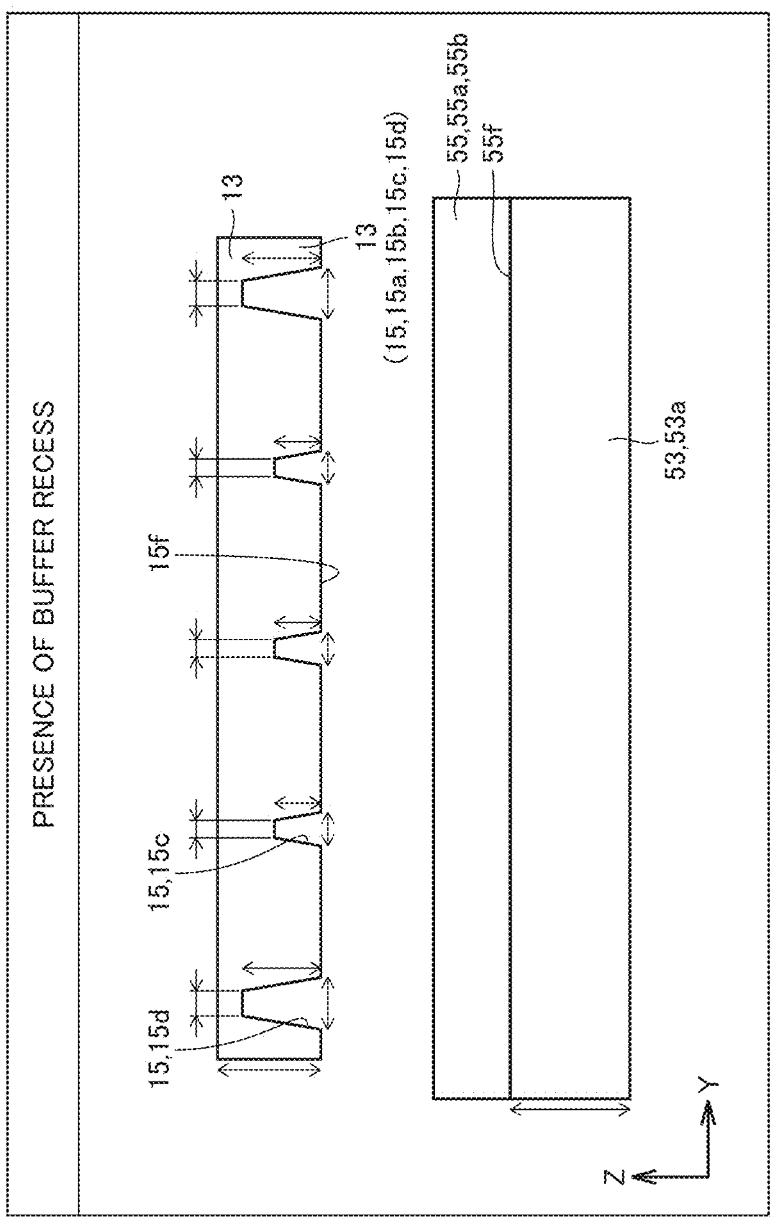
FIG. 16 is a seventh diagram for describing the workings and effects of the power semiconductor device in the first embodiment.

FIG. 15 illustrates models of module base 13 and heat sink base part 53 parallel to the Y-Z plane. This model is a model according to a comparative example in which no buffer recess is formed on module base 13. FIG. 16 illustrates models of module base 13 and heat sink base part 53 parallel to the Y-Z plane. This model is a model according to the embodiment in which a buffer recess is formed on module base 13.

The dimensions (see dimension lines) such as the depths and the widths of recesses 15*a* and 15*b* on module base 13 were each set at about several mm. The thickness (see a dimension line) of module base 13 was set at about several tens of mm. In addition, the dimensions (see dimension lines) such as the depths and the widths of buffer recesses 15*c* and 15*d* were each set at about several mm.

The height, the width, and the like (see dimension lines) of protrusion 55*a* on heat sink base part 53 were each set at about several mm. The thickness (see a dimension line) of heat sink base part 53 was set at about ten mm. The position (see a dotted line) of the central line of uneven part 55 (protrusion 55*a* or protrusion 55*b*) in the X-axis direction and the position (see a dotted line) of the central line of uneven part 15 (recess 15*a* or 15*b*) in the X-axis direction matched each other.

In addition, the A1050 series of pure aluminum was set as the quality of a material of module base 13. The aluminum-magnesium-silicon-based A6063 series was set as the quality of a material of heat sink base part 53. It was evaluated by using these models how much protrusion 55*a* of heat sink base part 53 was inserted in recess 15*a* of module base 13 in accordance with the presence and absence of a buffer recess.

Figure 17:
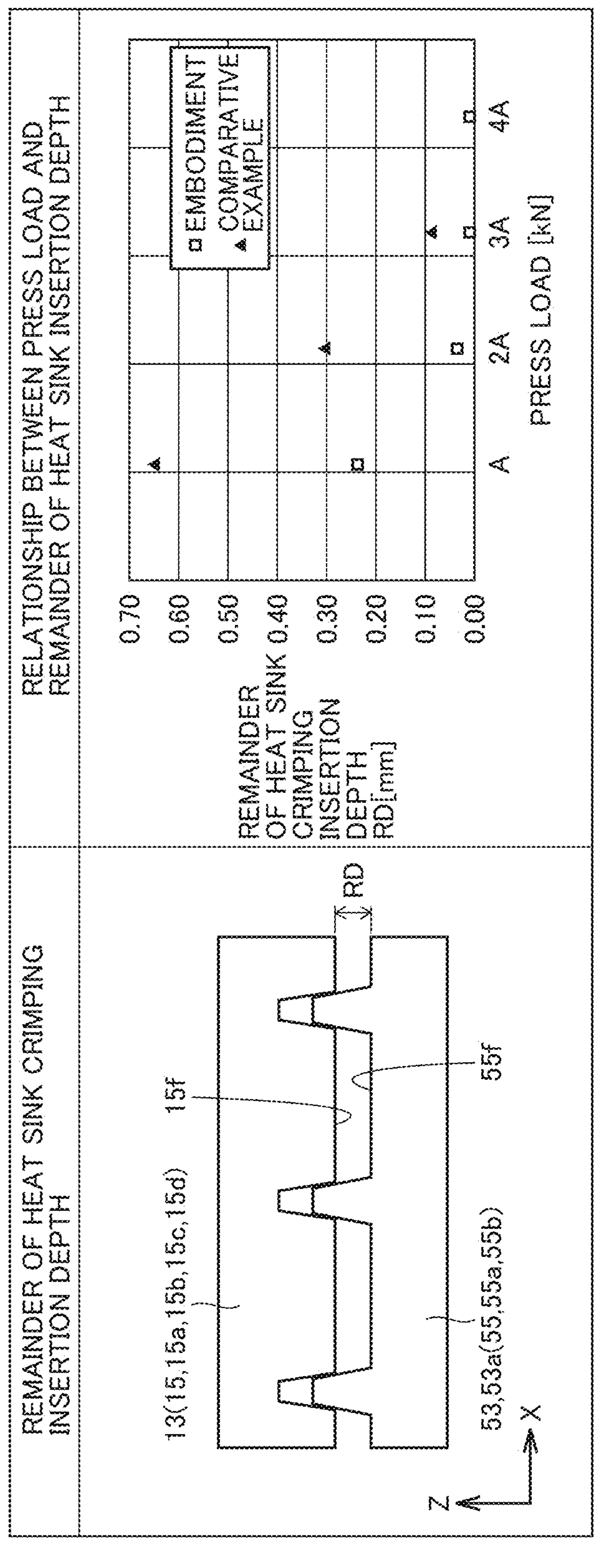
FIG. 17 is an eighth diagram for describing the workings and effects of the power semiconductor device in the first embodiment.

A result of that is illustrated in FIG. 17. FIG. 17 illustrates a relationship between a press load and a gap RD between module base 13 and heat sink base part 53. Gap RD corresponds to the remaining length of heat sink crimping insertion depth. FIG. 17 illustrates the case of the application of the reference load (1 AkN), the case of the application of the load (2 AkN) that is 2.0 times greater than the reference load, the case of the application of the load (3 AkN) that is 3.0 times greater than the reference load, and the case of the application of the load (4 AkN) that is 4.0 times greater than the reference load.

Here, it is assumed that heat sink crimping is completed when gap RD is 0.05 mm or less. This indicates that a load of 4 AkN has to be applied in the comparative example to complete heat sink crimping, but the application of a load of 2 AkN allows heat sink crimping to be completed in the first embodiment.

This indicates that the formation of buffer recess 15*c* on module base 13 in power semiconductor device 1 according to the first embodiment makes it possible to reduce a press load necessary to complete heat sink crimping by about 50%.

It is to be noted that the result of the evaluation described above is an example. The sophistication of a structure including buffer recess 15*c* in module base 13 and heat sink base part 53 makes it possible to further reduce a press load. In addition, the evaluation has been made for the case where the material of module base 13 and the material of heat sink base part 53 are different materials. It is, however, considered possible to obtain an effect similar to the effect in the case of different materials even when the material of module base 13 and the material of heat sink base part 53 are the same material.

It is to be noted that the strength of holding module base 13 and heat sink base part 53 after heat sink crimping is adjustable by increasing and decreasing the region (area) in which buffer recess 15*c* is provided that is left as a space with power module part 11 and heat sink base part 53 joined together. The holding strength is vertical tensile strength in this case. The holding strength is the maximum strength applied to module base 13 and heat sink base part 53 under tension immediately before module base 13 and heat sink base part 53 are pulled apart. It is sufficient if the region (area) of buffer recess 15*c* is adjusted to the degree to which an effect of reducing a press load is obtained when the strength of holding module base 13 and heat sink base part 53 is requested.

In addition, when the planar shape of power semiconductor device 1 is a rectangular shape (rectangle), it is sufficient if the buffer recess is disposed to perform the function. In addition, when the dimensions of uneven part 15 and the like are adjusted, any of a disposition structure in which buffer recesses 15*c* are formed along a long side and a disposition structure in which buffer recesses 15*c* are formed along a short side may be adopted as the disposition structure of buffer recesses 15*c*.

Figure 18:
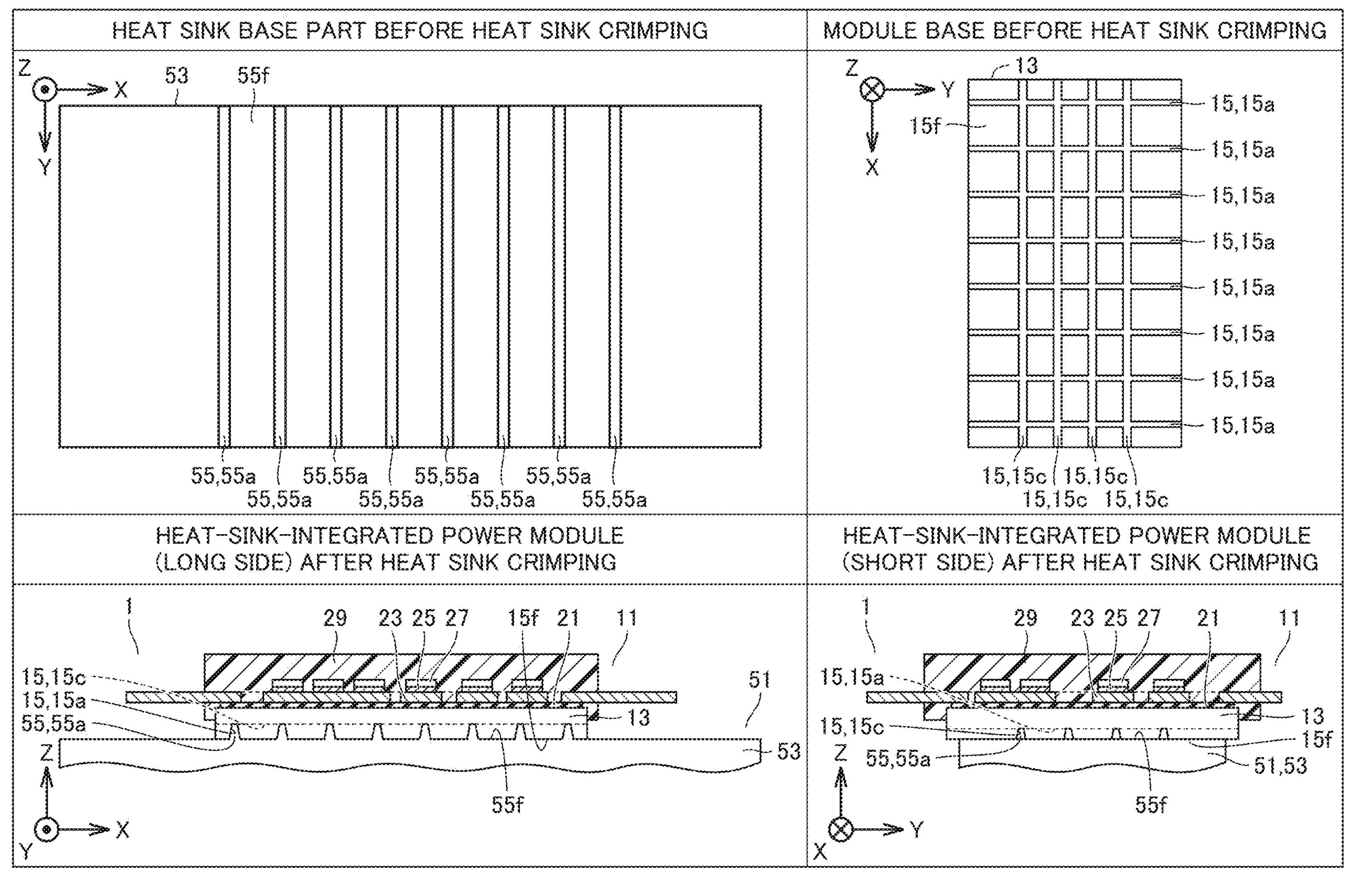
FIG. 18 is a first diagram for describing a disposition structure of an uneven part formed on a module base and a disposition structure of an uneven part formed on a heat sink base part in the first embodiment.

FIG. 18 illustrates an example of the disposition structure in which buffer recesses 15*c* are formed along a long side. FIG. 18 illustrates heat sink base part 53 and module base 13 before heat sink crimping. In addition, a heat-sink-integrated power module (power semiconductor device 1) after heat sink crimping is illustrated. As illustrated in the upper right part of FIG. 18, recesses 15*a* are formed on module base 13 along the Y-axis direction (short side) and buffer recesses 15*c* are formed along the X-axis direction (long side).

Figure 19:
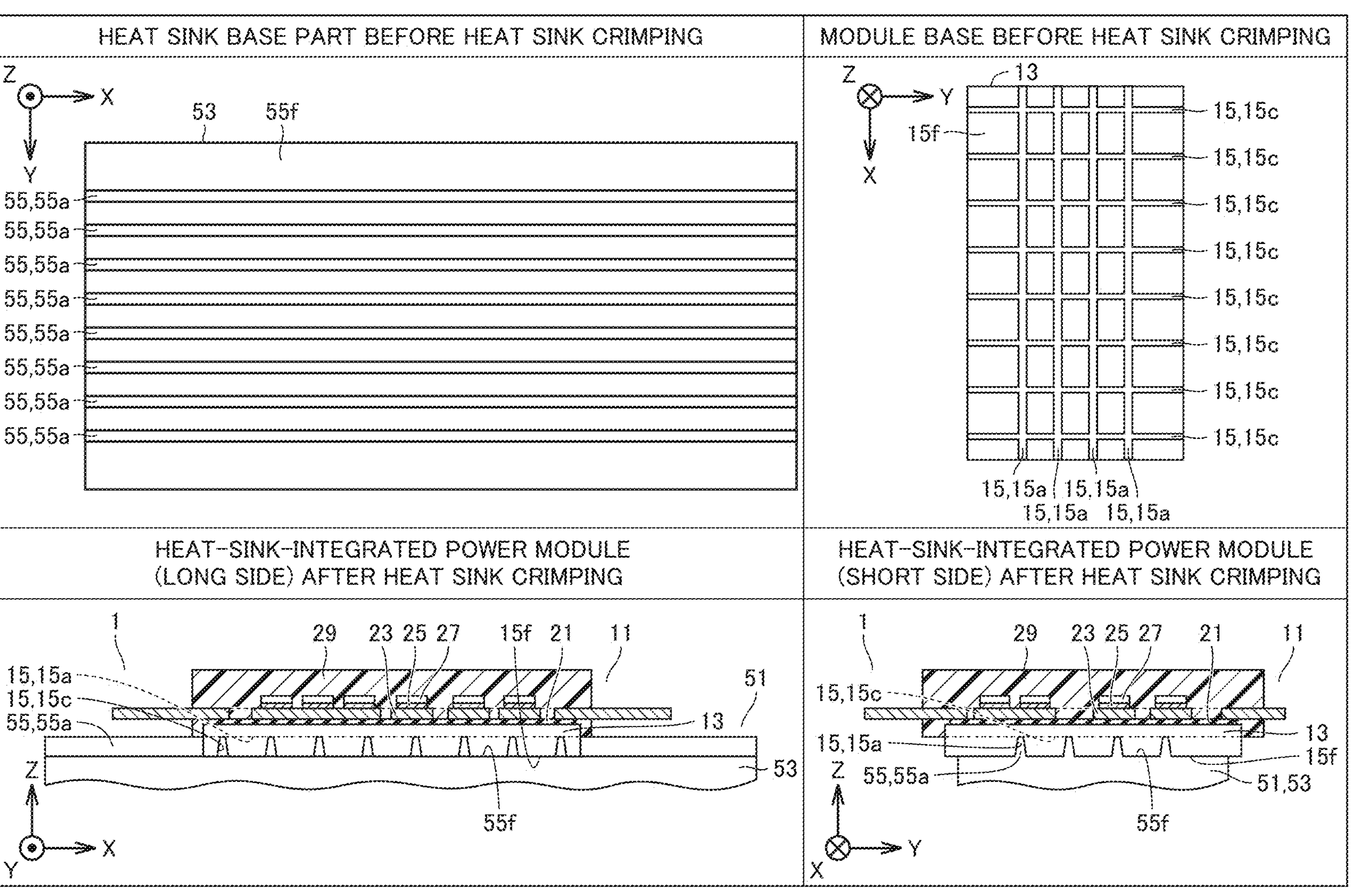
FIG. 19 is a second diagram for describing the disposition structure of the uneven part formed on the module base and the disposition structure of the uneven part formed on the heat sink base part in the first embodiment.

In contrast, FIG. 19 illustrates an example of the disposition structure in which buffer recesses 15*c* are formed along a short side. FIG. 19 illustrates heat sink base part 53 and module base 13 before heat sink crimping. In addition, a heat-sink-integrated power module (power semiconductor device 1) after heat sink crimping is illustrated. As illustrated in the upper right part of FIG. 19, recesses 15*a* are formed on module base 13 along the X-axis direction (long side) and buffer recesses 15*c* are formed along the Y-axis direction (short side).

(Buffer Recess Variation)

The case has been described as an example where four buffer recesses 15*c* each extending in the X-axis direction are formed as buffer recesses 15*c* formed on module base 13 in power semiconductor device 1 described above (see FIG. 2).

Figure 20:
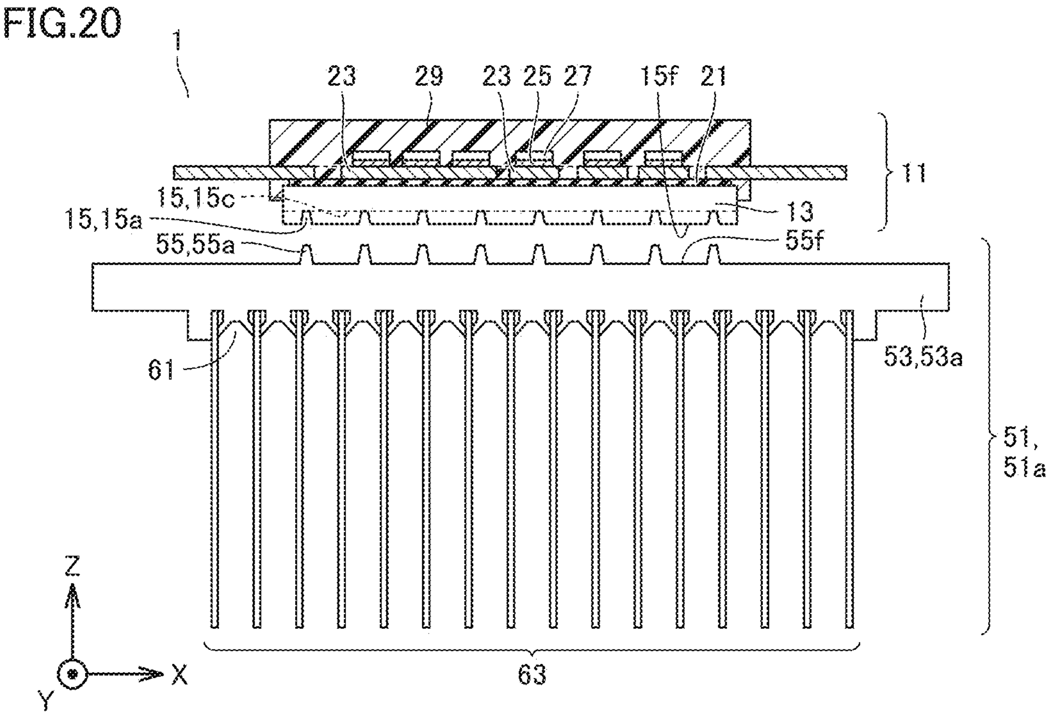
FIG. 20 is a first exploded side view illustrating a second modification example of the structure of the uneven part in the first embodiment, the first exploded side view including a partial cross section.
Figure 21:
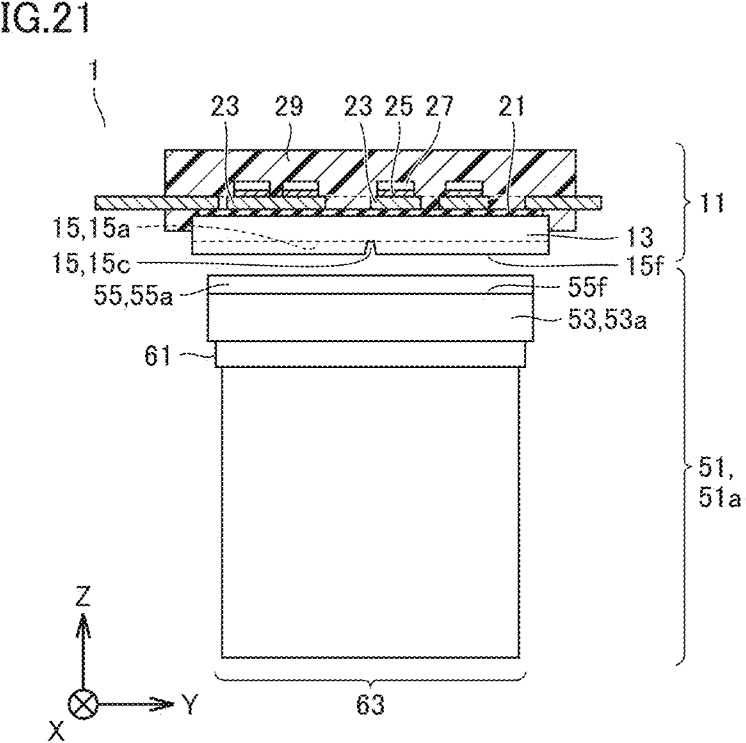
FIG. 21 is a second exploded side view illustrating the second modification example of the structure of the uneven part in the first embodiment, the second exploded side view including a partial cross section.
Figure 22:
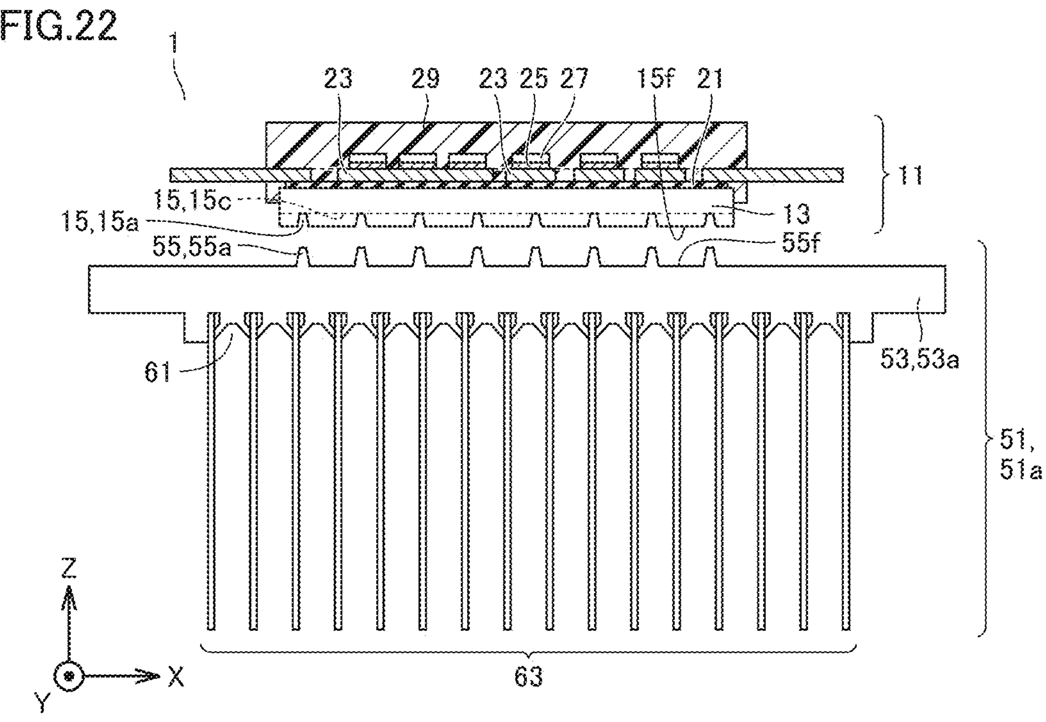
FIG. 22 is a first exploded side view illustrating a third modification example of the structure of the uneven part in the first embodiment, the first exploded side view including a partial cross section.
Figure 23:
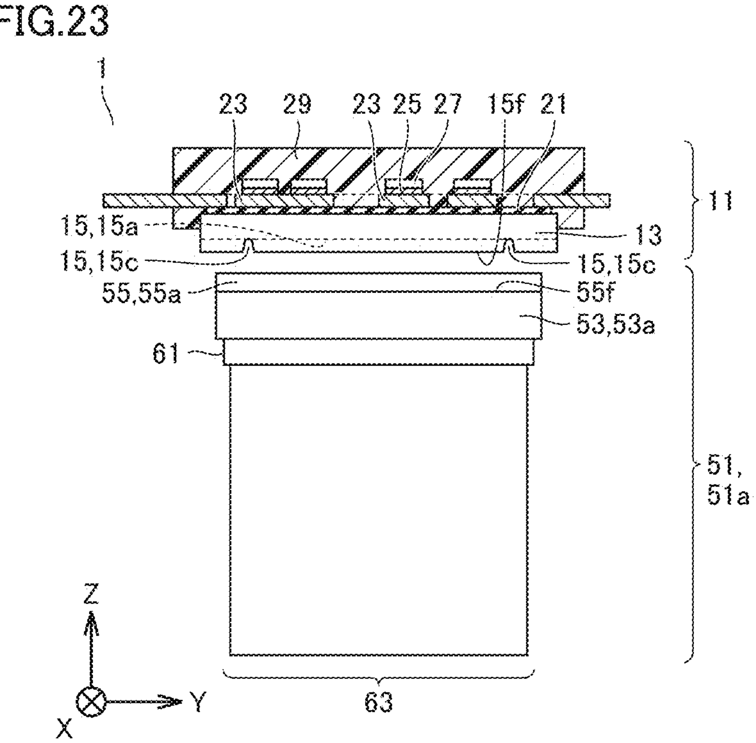
FIG. 23 is a second exploded side view illustrating the third modification example of the structure of the uneven part in the first embodiment, the second exploded side view including a partial cross section.

Buffer recesses 15*c* are not limited to this. As illustrated in FIGS. 20 and 21, power semiconductor device 1 may be adopted in which one buffer recess 15*c* extending in the X-axis direction is formed on module base 13. In addition, as illustrated in FIGS. 22 and 23, power semiconductor device 1 may be adopted in which two buffer recesses 15*c* each extending in the X-axis direction are formed on module base 13. As long as at least one of such buffer recesses 15*c* is formed, it is possible to reduce a press load as with power semiconductor device 1 described above and contribute to an increase in productivity.

Figure 24:
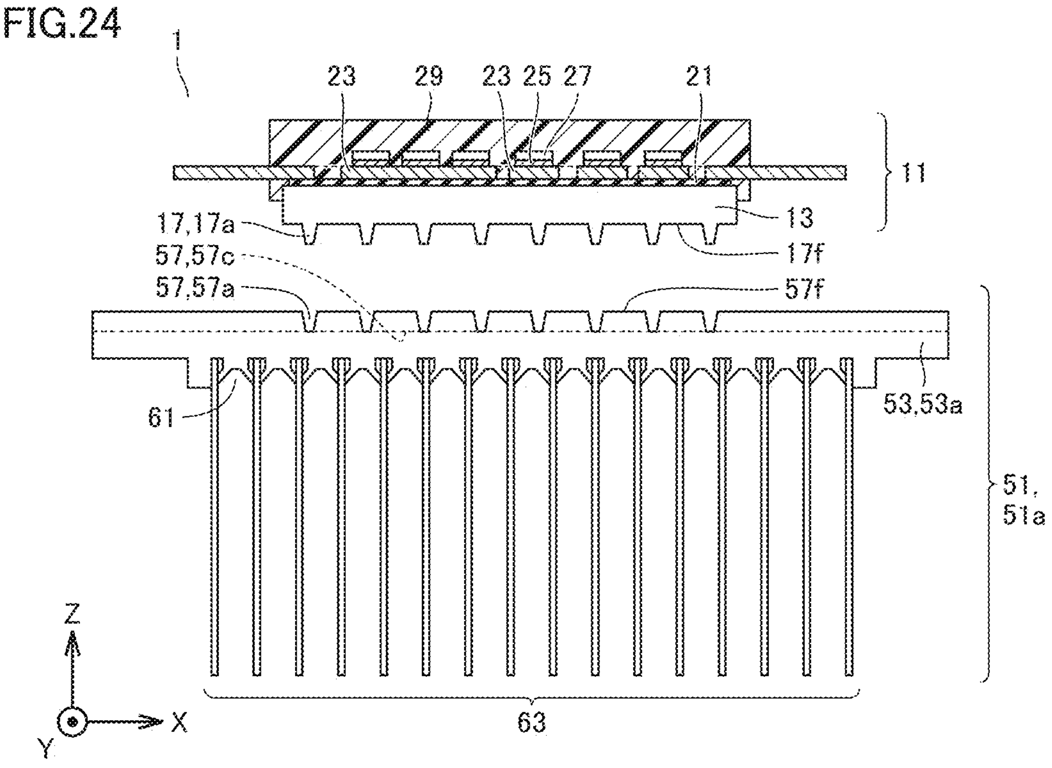
FIG. 24 is a first exploded side view illustrating a fourth modification example of the structure of the uneven part in the first embodiment, the first exploded side view including a partial cross section.
Figure 25:
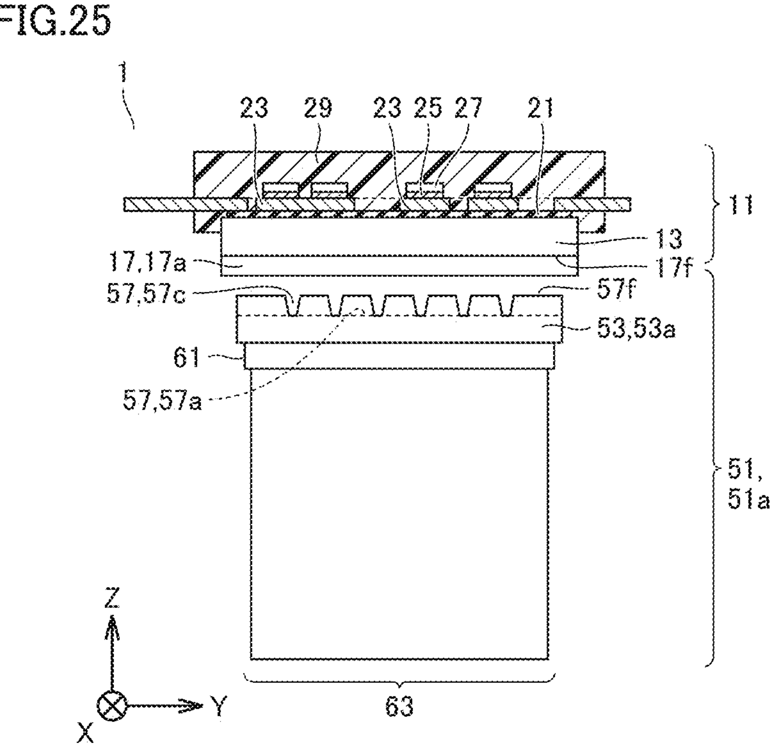
FIG. 25 is a second exploded side view illustrating the fourth modification example of the structure of the uneven part in the first embodiment, the second exploded side view including a partial cross section.

In addition, power semiconductor device 1 described above has been described by using, as an example, the structure in which buffer recess 15*c* is formed on module base 13. The buffer recess may be, however, formed on heat sink base part 53. As illustrated in FIGS. 24 and 25, an uneven part 17 is formed on module base 13 in power semiconductor device 1. Uneven part 17 has an uneven shape in which a protrusion 17*a* is formed in a flat part 17*f*.

An uneven part 57 is formed on heat sink base part 53 (heat radiation diffusion part 53*a*). Uneven part 57 includes a recess 57*a* and a buffer recess 57*c*. Recess 57*a* is formed to extend in the Y-axis direction. Buffer recess 57*c* is formed to extend in the X-axis direction. Uneven part 57 has an uneven shape in which recess 57*a* and buffer recess 57*c* are formed in a flat part 57*f*.

Uneven part 57 formed on heat sink base part 53 includes buffer recess 15*c* that is left as a space with power module part 11 and heat sink base part 53 joined together. This makes it possible to reduce a press load as with power semiconductor device 1 described above and contribute to an increase in productivity.

Figure 26:
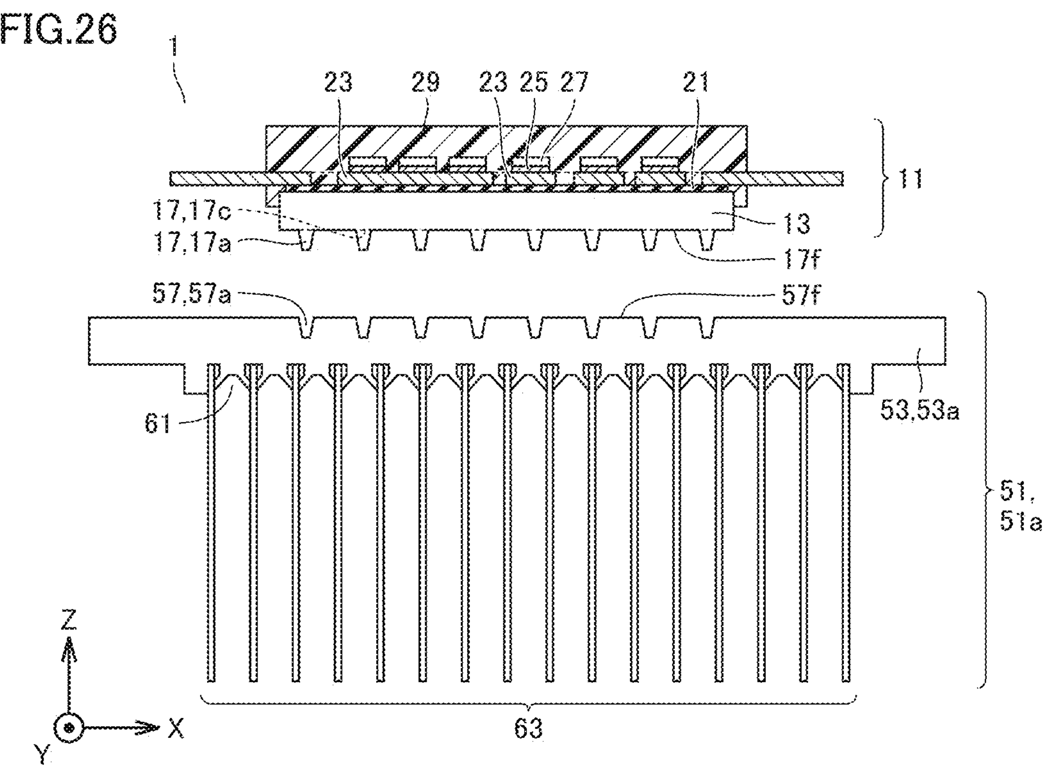
FIG. 26 is a first exploded side view illustrating a fifth modification example of the structure of the uneven part in the first embodiment, the first exploded side view including a partial cross section.
Figure 27:
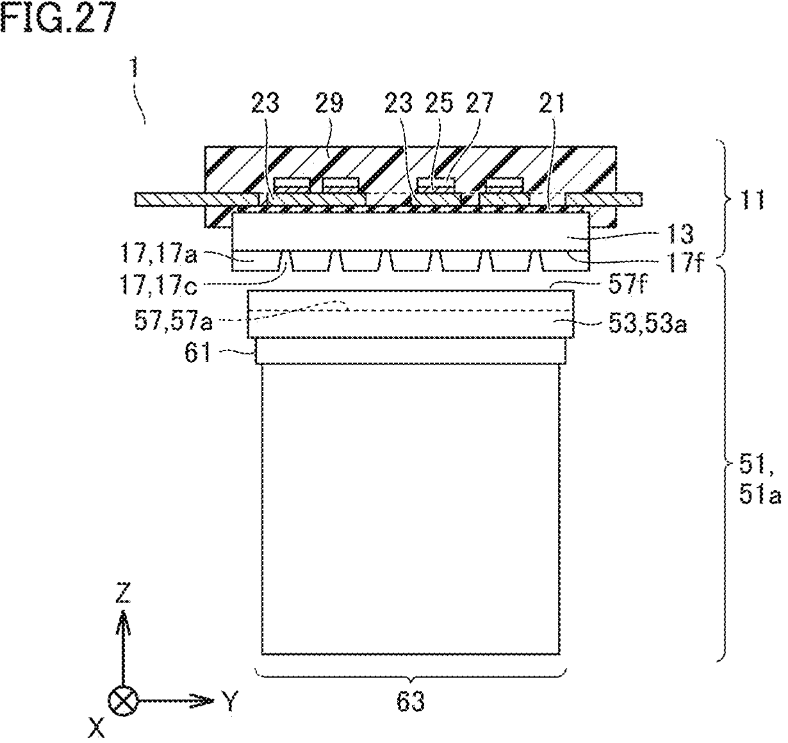
FIG. 27 is a second exploded side view illustrating the fifth modification example of the structure of the uneven part in the first embodiment, the second exploded side view including a partial cross section.

Further, as illustrated in FIGS. 26 and 27, in the case of power semiconductor device 1 in which uneven part 17 and uneven part 57 are formed, a buffer recess 17*c* may be formed on module base 13 in a direction that crosses the direction in which protrusion 17*a* extends. Such power semiconductor device 1 also makes it possible to reduce a press load as with power semiconductor device 1 described above and contribute to an increase in productivity.

Figure 28:
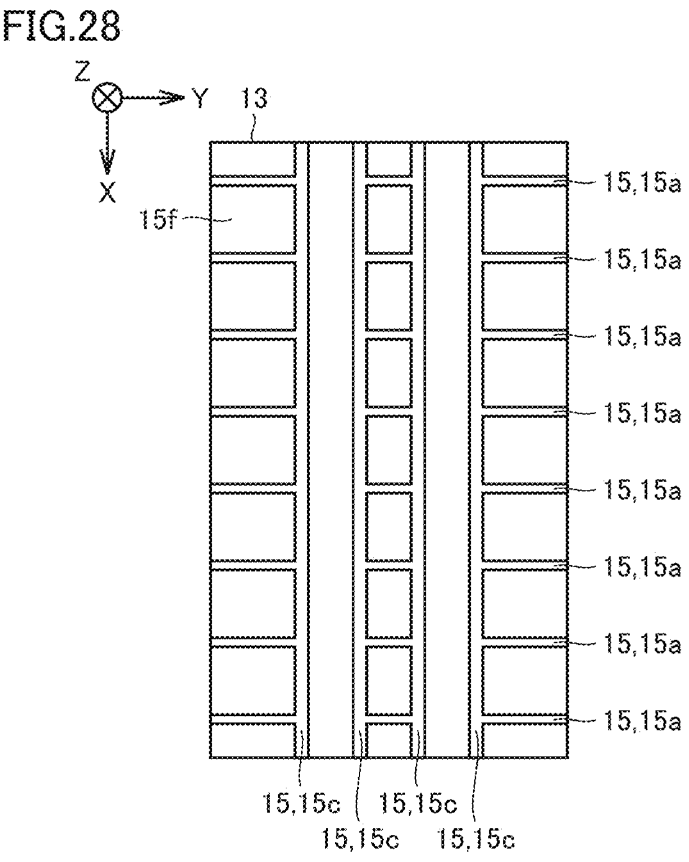
FIG. 28 is a bottom view illustrating a modification example of a pattern of the uneven part formed on the module base in the power module part in the first embodiment.

In addition, in uneven parts 15 and 17 formed on module base 13 and uneven parts 55 and 57 formed on heat sink base part 53, recesses 15*a* and the like or protrusions 55*a* and the like may be continuously formed or partially formed to be discontinuous. FIG. 28 illustrates, as an example, a case where recesses 15*a* of uneven parts 15 formed on module base 13 are discontinuously formed. In such a manner, for example, buffer recesses 15*c* may be discontinuously formed. In this case, it is sufficient if the region (area) of recesses 15*a* or buffer recesses 15*c* is adjusted to the degree to which an effect of reducing a press load is obtained on the assumption (under the condition) that the strength of holding module base 13 and heat sink base part 53 is secured.

Further, when a molding die is used to seal chip 27 and the like mounted on power module part 11 with mold resin 29 in power semiconductor device 1 described above, it is possible to reduce the warpage of power module part 11 by placing module base 13 on the molding die.

For example, the molding die is provided with a support part corresponding to buffer recess 15*c* or the like in uneven part 15 of module base 13 that is not fitted with uneven part 55 or 57 of heat sink base part 53, thereby causing module base 13 to be reliably supported up by the molding die. This allows power module part 11 to be less warped after being sealed with mold resin 29. As a result, it is possible to prevent chip 27, mold resin 29, or the like from having a crack and increase productivity.

(Heat Radiator Fin)

A heat radiator fin 63 of heat sink 51 is a plate (rolled material) that is formed by using, for example, aluminum, aluminum alloy, or the like. Formation into such a plate allows both processability and heat radiation performance to be achieved.

Further, minute dents may be formed on a surface of heat radiator fin 63 by an embossing process on heat radiator fin 63. The formation of dents on the surface of heat radiator fin 63 increases the heat radiation surface area of heat radiator fin 63 and makes it possible to increase the heat radiation performance. In addition, it is possible to perform an embossing process with a die that is used to manufacture heat radiator fin 63 by a pressing process. This makes it possible to perform an embossing process on the surface of heat radiator fin 63 without increasing the production cost.

Further, when heat radiator fins 63 each subjected to an embossing process are stacked, the contact area decreases between heat radiator fin 63 and heat radiator fin 63 that are adjacent to each other. It is possible to reduce the surface friction between heat radiator fins 63. This makes it possible to simplify production equipment that is used for a crimping process of integrating heat sink base part 53 and heat radiator fins 63. In addition, it is possible to shorten time for production and increase productivity.

In addition, it is possible to cause heat radiator fins 63 each subjected to an embossing process to attain an anchor effect by crimp part 61 digging into a dent resulting from the embossing process when a crimping process is performed to crimp heat radiator fin 63 to heat sink base part 53. This increases frictional force in the direction in which heat radiator fins 63 are pulled out from the crimp parts and makes it possible to increase the vertical tensile strength of heat radiator fins 63 with respect to heat sink base part 53.

Here, when the hardness of heat radiator fins 63 is higher (greater) than the hardness of heat sink base part 53, crimp parts 61 of heat sink base part 53 plastically deform along the surfaces of heat radiator fins 63 each subjected to an embossing process rather than digging into heat radiator fins 63. This makes it possible to increase the vertical tensile strength of the heat radiator fins each subjected to an embossing process with respect to heat sink base part 53.

In contrast, when the hardness of heat sink base part 53 (crimp parts 61) is higher (greater) than the hardness of heat radiator fins 63, crimp parts 61 dig into the surfaces of heat radiator fins 63 to plastically deform heat radiator fins 63. In this case, the plastic deformation of heat radiator fins 63 rather than an effect brought about by an embossing process makes it possible to increase the vertical tensile strength with respect to heat sink base part 53.

These findings indicate that it is desirable to adopt at least any of the following techniques to increase the vertical tensile strength of heat radiator fins 63 with respect to heat sink base part 53: a technique of performing an embossing process on the surface of each heat radiator fin 63; and a technique of making the hardness of heat sink base part 53 (crimp parts 61) higher (greater) than the hardness of heat radiator fins 63.

The inventors fabricated a sample (sample A) in which heat sink base part 53 was formed by using an aluminum 6000 series material of aluminum-magnesium-silicon alloy and heat radiator fins 63 were each formed by using an aluminum 1000 series material of pure aluminum and evaluated the vertical tensile strength. In addition, the inventors fabricated, as a comparative example, a sample (sample B) in which both heat sink base part 53 and heat radiator fin 63 were formed by using an aluminum 1000 series material of pure aluminum and evaluated the vertical tensile strength. Results of them indicate that the vertical tensile strength of sample A was about 2.5 to 3.6 times greater than the vertical tensile strength of sample B.

It is to be noted that materials of module base 13, heat sink base part 53, and heat radiator fin 63 are not limited to an aluminum-based material in power semiconductor device 1, but an optimum material is appropriately used in accordance with the specifications of power semiconductor device 1. For example, from the perspective of heat radiation ability, the application of a copper-based plate having higher thermal conductivity than that of an aluminum-based material as heat radiator fin 63 makes it possible to further increase heat radiation performance.

Figure 29:
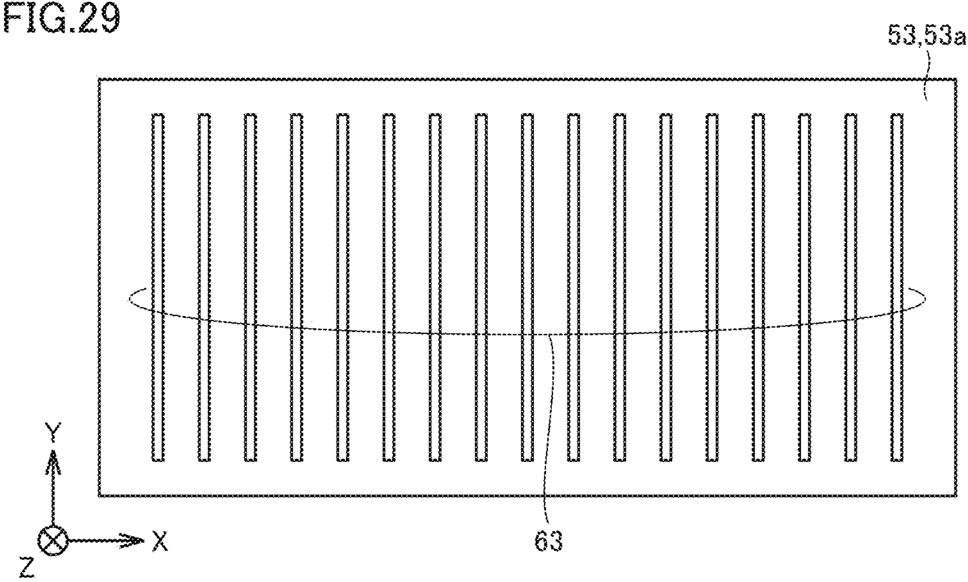
FIG. 29 is a bottom view illustrating a first example of a disposition structure of heat radiator fins in the heat sink in the first embodiment.
Figure 30:
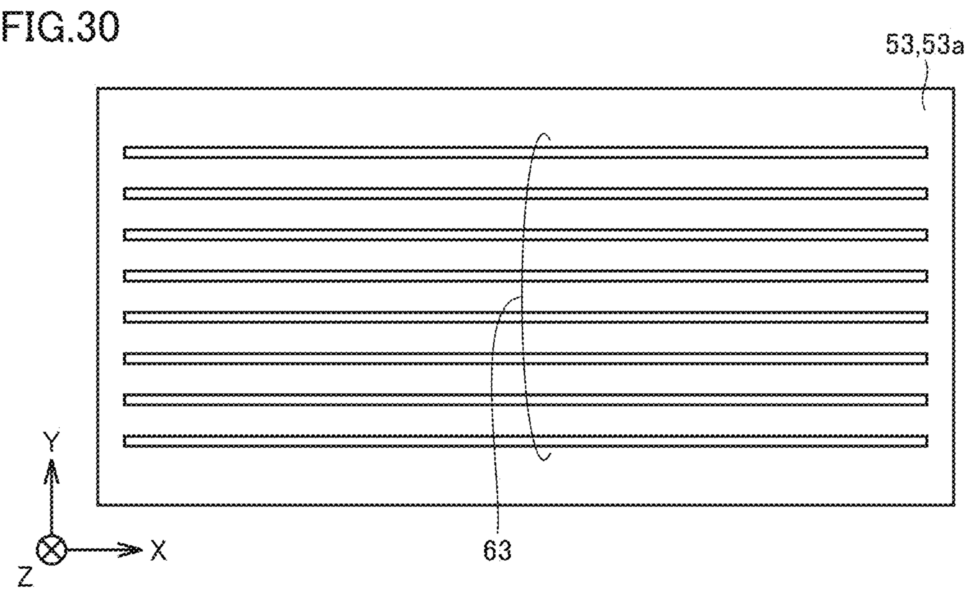
FIG. 30 is a bottom view illustrating a second example of the disposition structure of the heat radiator fins in the heat sink in the first embodiment.

In addition, a first disposition structure and a second disposition structure are conceivable as the disposition structure of heat radiator fins 63 in power semiconductor device 1 described above. As illustrated in FIG. 29, the first disposition structure is a structure in which heat radiator fins 63 are disposed along the direction that is substantially orthogonal to a long side of heat sink base part 53. In other words, the first disposition structure is a structure in which heat radiator fins 63 are disposed along a short side of heat sink base part 53. In contrast, as illustrated in FIG. 30, the second disposition structure is a structure in which heat radiator fins 63 are disposed along the direction that is substantially orthogonal to a short side of heat sink base part 53. In other words, the second disposition structure is a structure in which heat radiator fins 63 are disposed along a long side of heat sink base part 53.

The first disposition structure is adopted when the disposition of heat radiator fins 63 along a short side offers higher cooling performance. In addition, the first disposition structure is adopted when the maximum temperature (junction temperature) at which a power semiconductor element operates does not decrease to requested specified temperature or less unless heat radiator fins 63 are disposed along a short side.

In contrast, the second disposition structure is adopted when the disposition of heat radiator fins 63 along a long side offers higher cooling performance. In addition, the second disposition structure is adopted when the maximum temperature (junction temperature) at which a power semiconductor element operates does not decrease to requested specified temperature or less unless heat radiator fins 63 are disposed along a long side.

In addition, when power module part 11 and another assembly part, for example, such as a bus bar that is connected to a control substrate or a main circuit terminal are electrically connected in power semiconductor device 1, the disposition of a main terminal, a control terminal, or the like on a long side of heat sink base part 53 makes the assembly easier in some cases.

In contrast, when power module part 11 and another assembly part are electrically connected, the disposition of the main terminal or the like on a short side of heat sink base part 53 makes the assembly easier in other cases. It is sufficient if power semiconductor device 1 described above adopts the first disposition structure or the second disposition structure in accordance with such a nearby structure.

In this way, power semiconductor device 1 adopts a structure in which power module part 11 and heat sink 51 are crimped to be integrated. This makes it possible to integrate heat sink 51 with one power module part 11. On heat sink 51, heat radiator fins 63 corresponding to, for example, the amount of heat to be generated or the like are disposed. This makes it possible to standardize power module part 11 and contribute to an increase in productivity.

In addition, it is possible to integrate heat sink 51 with power module part 11. Heat sink 51 has a structure corresponding to a disposition relationship between nearby assembly parts in power semiconductor device 1. For example, in the case of a change or the like of an assembly part, it is thus sufficient if heat sink 51 corresponding to the assembly part to be changed is integrated with power module part 11. This makes it possible to increase the degree of design freedom of power semiconductor device 1 and peripherals.

Figure 31:
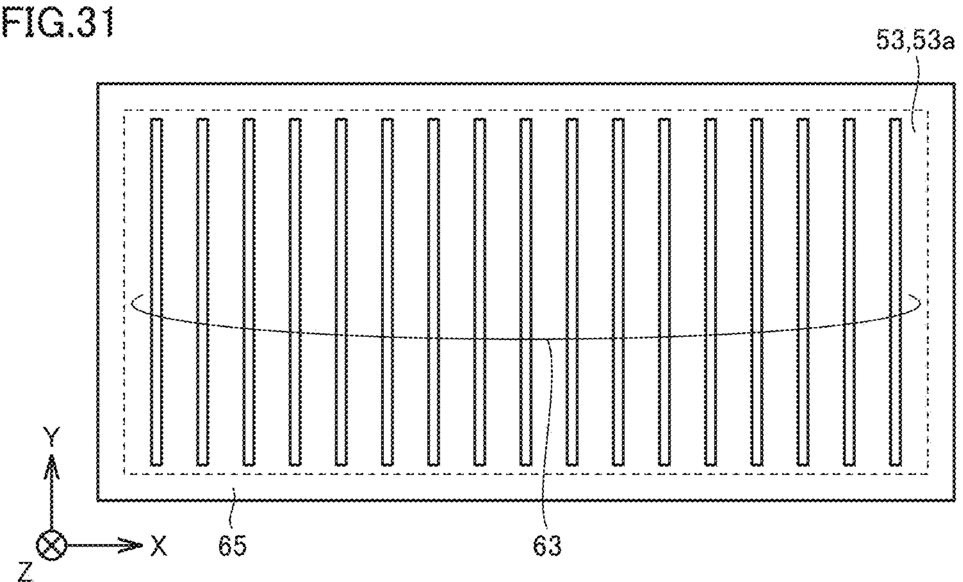
FIG. 31 is a bottom view for describing workings and effects of the heat sink illustrated in FIG. 29 in the first embodiment.

Further, in a first disposition manner of heat radiator fins 63, the disposition of heat radiator fins 63 in a region other than an outer peripheral region positioned along the outer periphery of heat sink base part 53 allows the outer peripheral region in heat sink base part 53 to function as a load reception part 65 for a crimping process as illustrated in FIG. 31.

Figure 32:
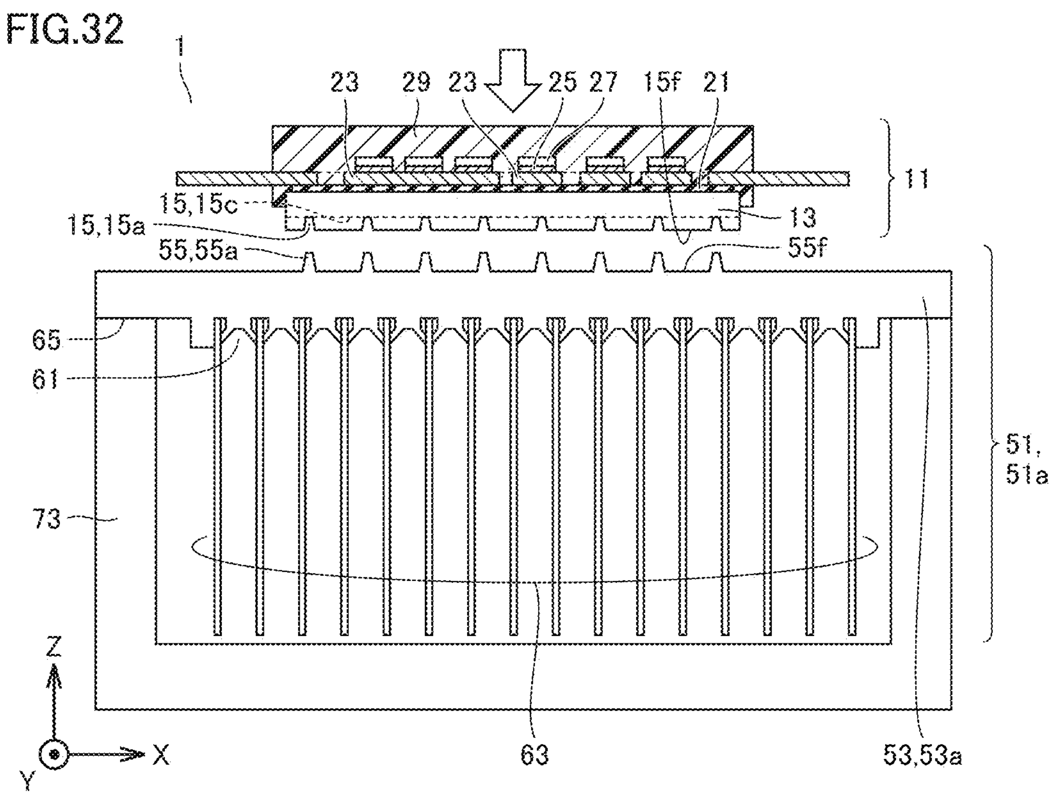
FIG. 32 is a side view including a partial cross section, the side view illustrating a step of the method for manufacturing the power semiconductor device for describing workings and effects of the heat sink illustrated in FIG. 29 in the first embodiment.

In this case, after heat radiator fins 63 are crimped to heat sink base part 53 by a crimping process, heat sink base part 53 is placed on a heat sink setting jig 73 as illustrated in FIG. 32. Next, power module part 11 is pressed down to heat sink base part 53 to fit uneven part 15 formed on module base 13 and uneven part 55 formed on heat sink base part 53 together and join power module part 11 to heat sink base part 53.

Figure 33:
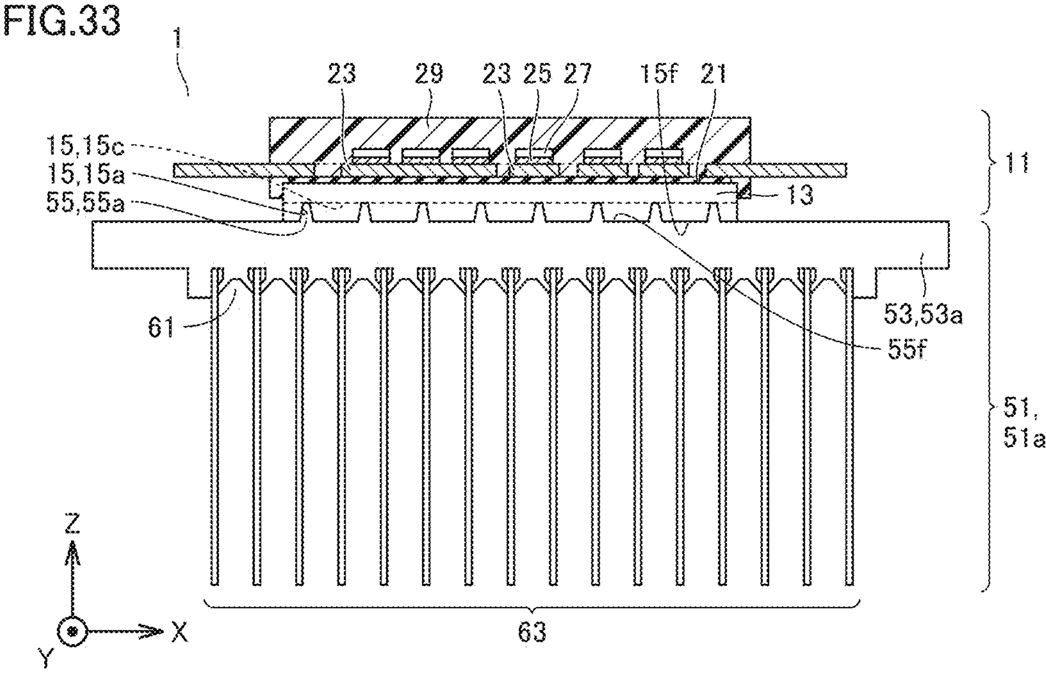
FIG. 33 is a side view including a partial cross section, the side view illustrating a step to be performed after the step illustrated in FIG. 32 for describing the workings and effects of the heat sink illustrated in FIG. 29 in the first embodiment.

After that, heat sink setting jig 73 is detached to manufacture power semiconductor device 1 in which power module part 11 and heat sink 51 (heat sink base part 53) are integrated as illustrated in FIG. 33.

In this way, power module part 11 and heat sink 51 are integrated by using heat sink setting jig 73 to make it possible to make the integration easier and more efficient than integration performed without using heat sink setting jig 73.

Figure 34:
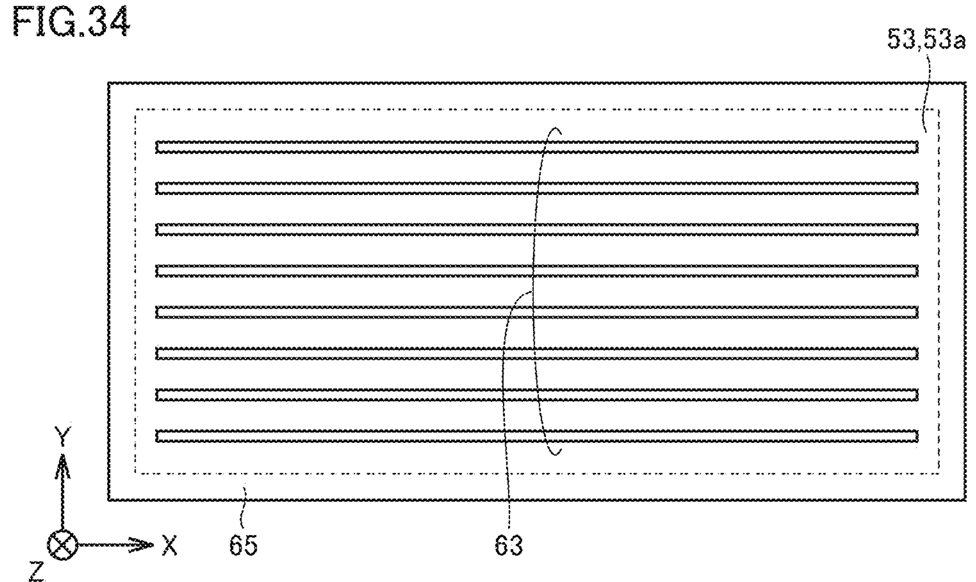
FIG. 34 is a bottom view for describing the workings and effects of the heat sink illustrated in FIG. 30 in the first embodiment.

In a second disposition manner of heat radiator fins 63, the disposition of heat radiator fins 63 in a region other than the outer peripheral region positioned along the outer periphery of heat sink base part 53 also allows the outer peripheral region in heat sink base part 53 to function as load reception part 65 for a crimping process as illustrated in FIG. 34. As a result, it is possible to integrate power module part 11 and heat sink 51 more easily and more efficiently as in the first disposition manner.

In addition, heat sink 51 in which heat radiator fins 63 and heat sink base part 53 are integrally formed may be applied as heat sink 51 of power semiconductor device 1 in addition to heat sink 51*a* having a crimped structure in which heat radiator fins 63 are crimped to heat sink base part 53.

Figure 35:
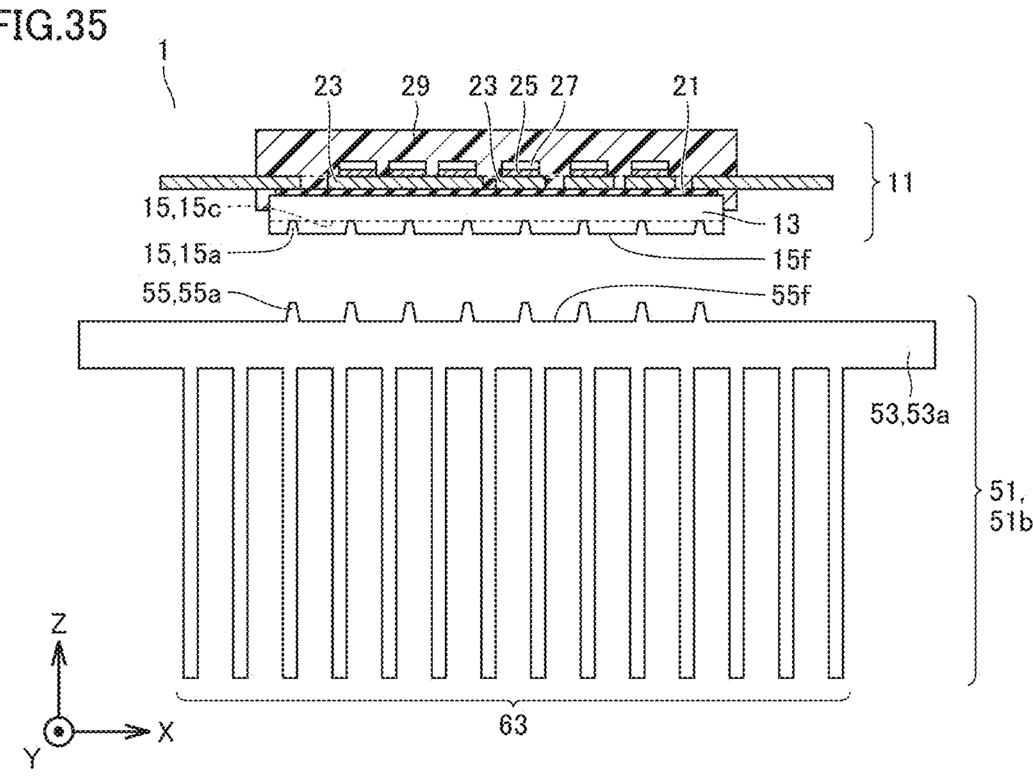
FIG. 35 is a first exploded side view illustrating a first modification example of a structure of the heat sink in the first embodiment, the first exploded side view including a partial cross section.
Figure 36:
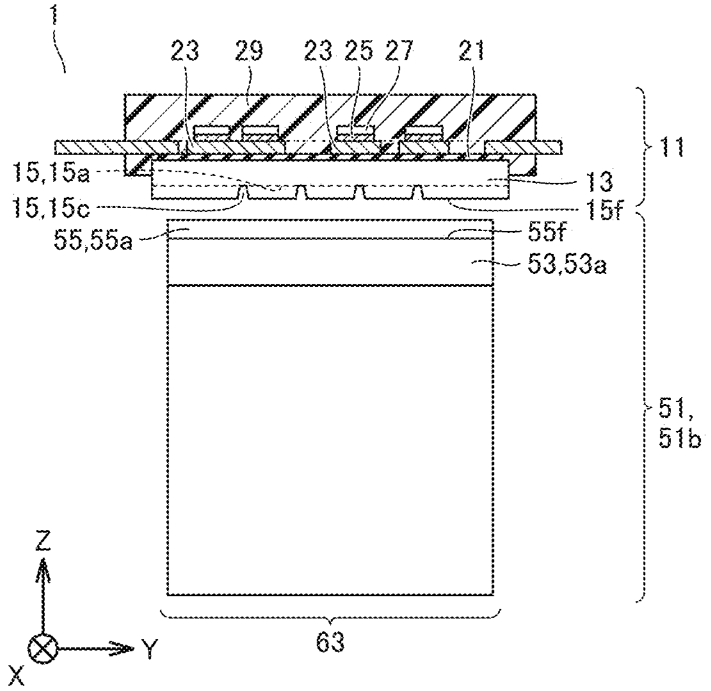
FIG. 36 is a second exploded side view illustrating the first modification example of the structure of the heat sink in the first embodiment, the second exploded side view including a partial cross section.
Figure 37:
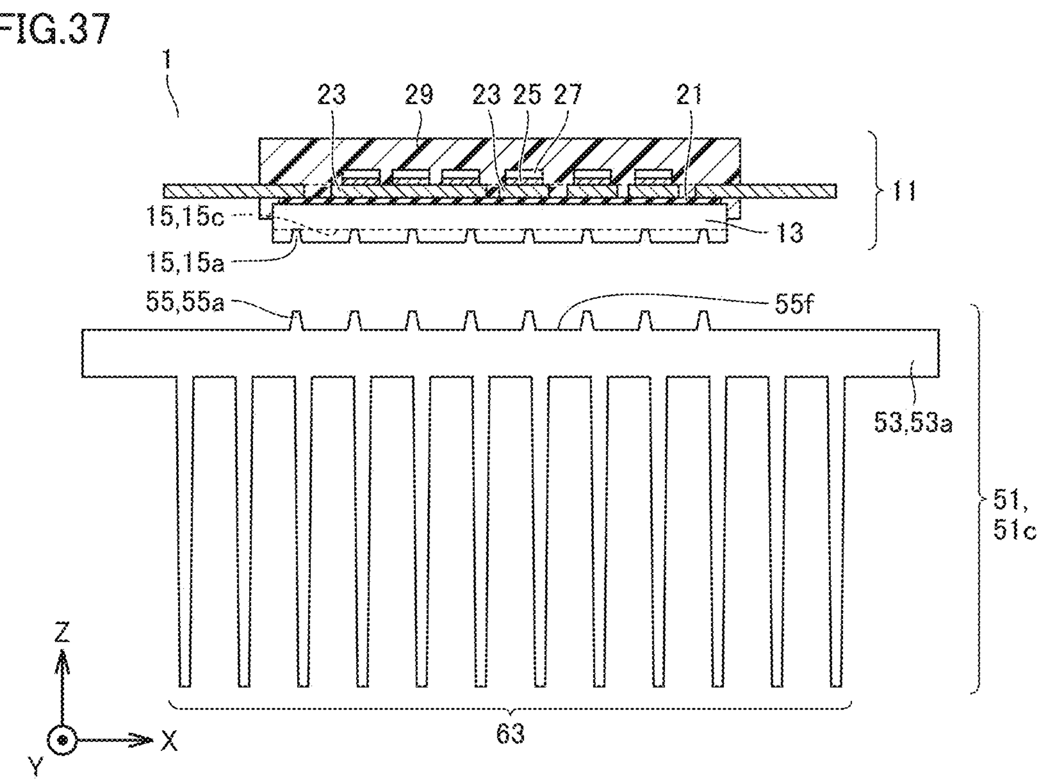
FIG. 37 is a first exploded side view illustrating a second modification example of the structure of the heat sink in the first embodiment, the first exploded side view including a partial cross section.
Figure 38:
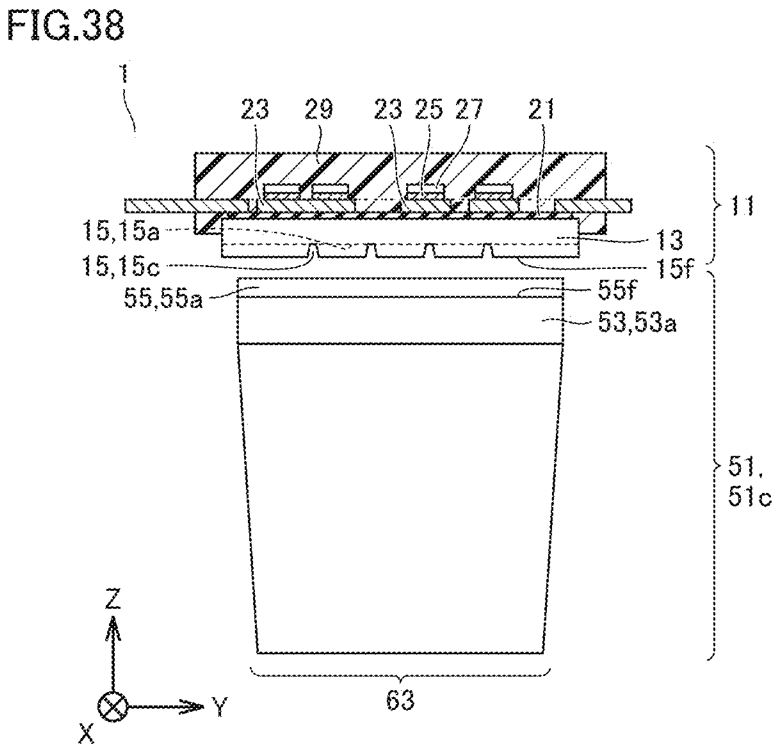
FIG. 38 is a second exploded side view illustrating the second modification example of the structure of the heat sink in the first embodiment, the second exploded side view including a partial cross section.

A heat sink 51*b* in which heat sink base part 53 and heat radiator fins 63 are integrally formed by an extruding process, a cutting process, or a forging process may be applied as heat sink 51 as illustrated in FIGS. 35 and 36. In addition, a heat sink 51*c* may be applied in which heat sink base part 53 and heat radiator fins 63 are integrally formed by a die casting process as illustrated in FIGS. 37 and 38.

The size of module base 13 of power module part 11 in power semiconductor device 1 is determined by a die that is used to manufacture one power semiconductor device 1. Therefore, when chip 27 generates a larger amount of heat to increase the heat density, it is possible to secure the heat radiation ability corresponding to the heat density by changing the size (width and depth) of heat sink base part 53 other than thickness, the number of heat radiator fins, and the size of each heat radiator fin in accordance with the heat density.

In other words, it is possible to join heat sink 51 that may address various amounts of heat generated in accordance with the specifications to one power module part 11. This makes it possible to standardize power module part 11 as compared with a power semiconductor device disclosed in each of PTLs 1 to 8 in which a mold unit including a mold resin and a module base part are each restricted in size. As a result, it is possible to contribute to an increase in the productivity of power semiconductor device 1 (power module part 11).

In addition, it is possible to integrate power module part 11 and heat sink 51 by using heat sink setting jig 73 (see FIG. 32) even in the case of such heat sink 51 (see FIGS. 35 and 36 and FIGS. 37 and 38) in which heat radiator fins 63 and heat sink base part 53 are integrally formed.

Figure 39:
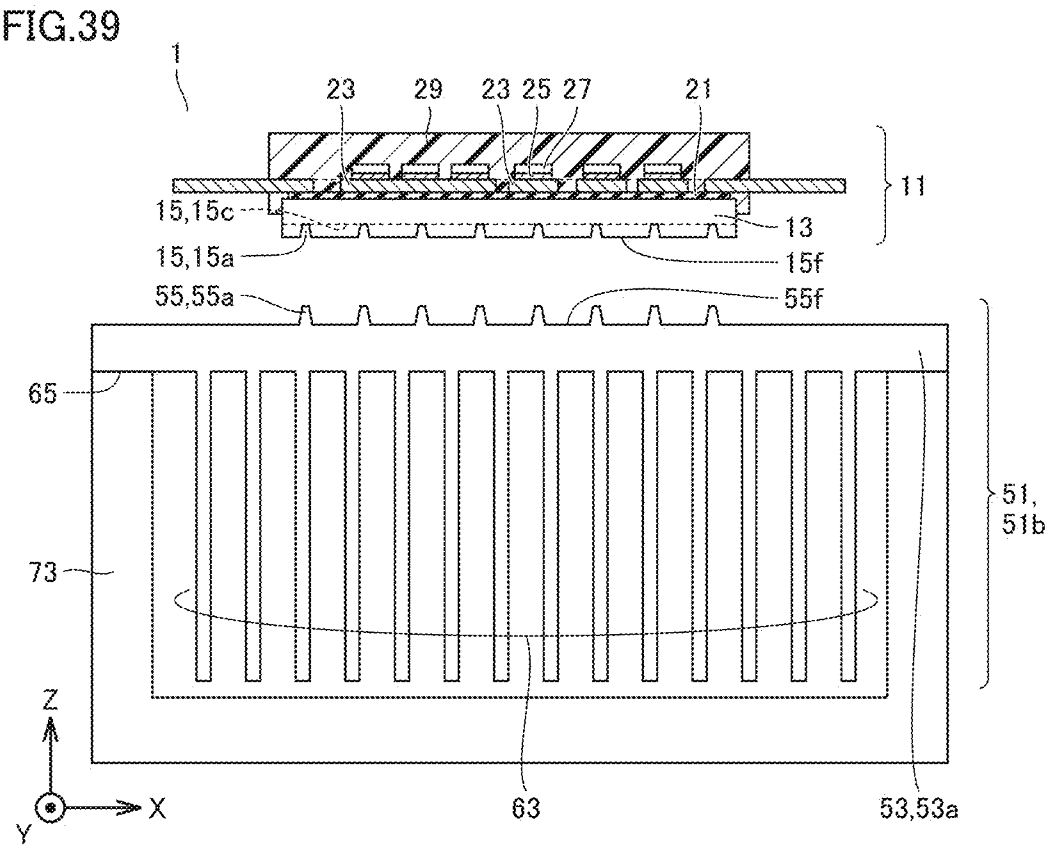
FIG. 39 is a side view including a partial cross section, the side view illustrating a step of the method for manufacturing the power semiconductor device for describing the workings and effects of the heat sink illustrated in any of FIGS. 35 and 36 in the first embodiment.

As illustrated in FIG. 39, heat sink 51*b* (FIGS. 35 and 36) in which heat radiator fins 63 and heat sink base part 53 are integrally formed is placed on heat sink setting jig 73. Next, power module part 11 is pressed down to heat sink base part 53 to fit uneven part 15 formed on module base 13 and uneven part 55 formed on heat sink base part 53 together and integrate power module part 11 and heat sink base part 53.

Figure 40:
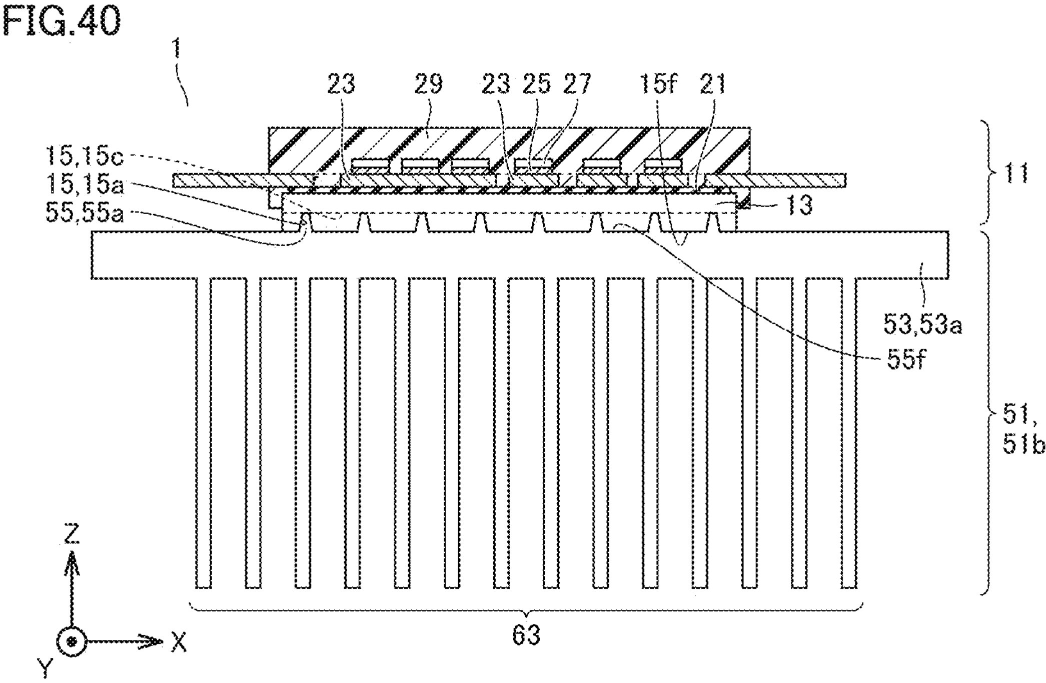
FIG. 40 is a side view including a partial cross section, the side view illustrating a step to be performed after the step illustrated in FIG. 39 for describing the workings and effects of the heat sink illustrated in any of FIGS. 35 and 36 in the first embodiment.

After that, heat sink setting jig 73 is detached to manufacture power semiconductor device 1 in which power module part 11 and heat sink 51 are integrated as illustrated in FIG. 40. In the case of heat sink 51 in which heat radiator fins 63 and heat sink base part 53 are integrated, the use of heat sink setting jig 73 makes it possible to integrate power module part 11 and heat sink 51 easily. It is to be noted that it is also possible to integrate power module part 11 and heat sink base part 53 similarly by using heat sink setting jig 73 in the case of heat sink 51*c* illustrated in FIGS. 37 and 38.

Second Embodiment

Figure 41:
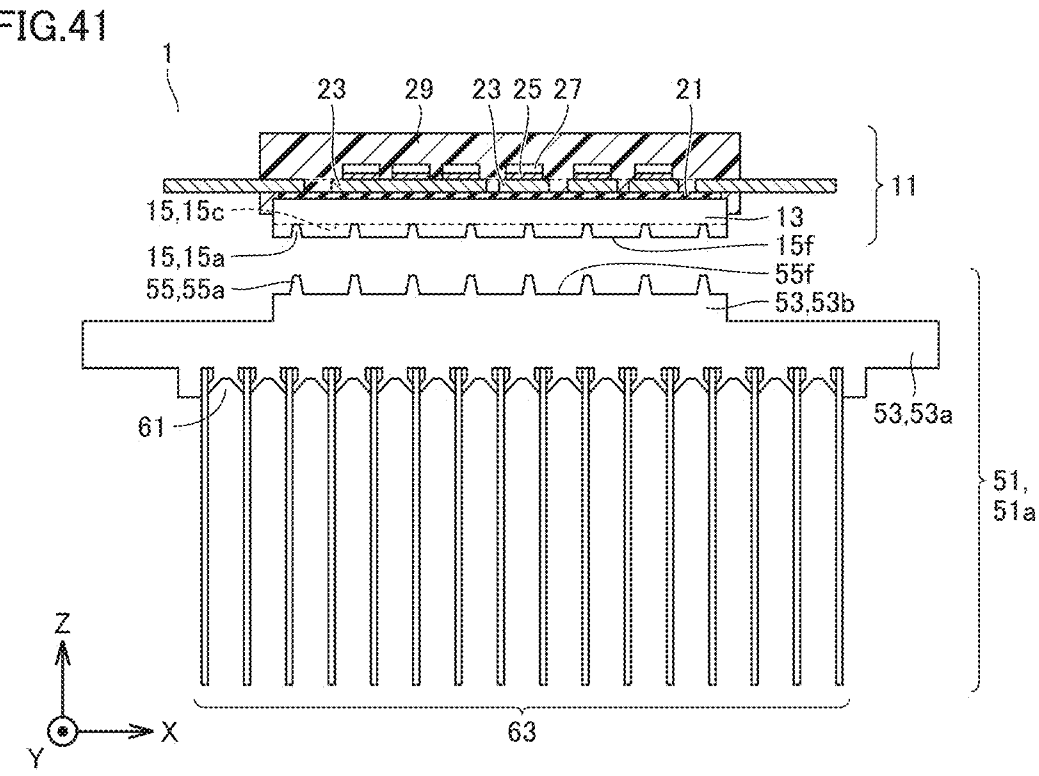
FIG. 41 is an exploded side view illustrating a power semiconductor device according to a second embodiment, the exploded side view including a partial cross section.
Figure 42:
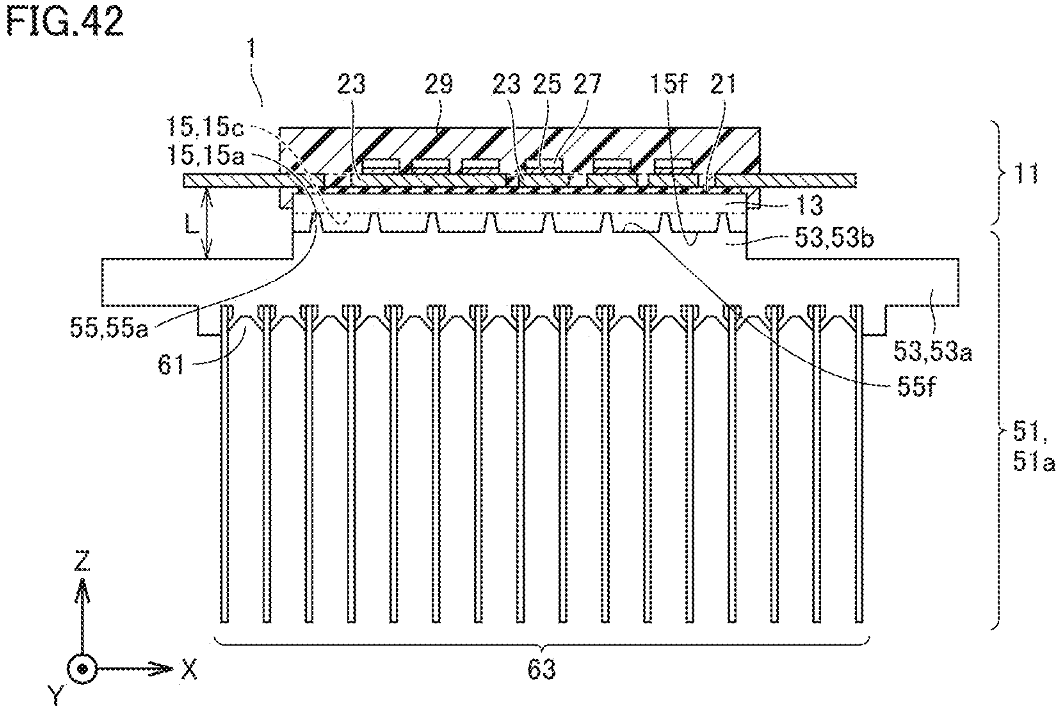
FIG. 42 is a side view illustrating an example in which a power module part and a heat sink are integrated in the second embodiment, the side view including a partial cross section.

An example of a power semiconductor device according to a second embodiment will be described. FIG. 41 illustrates an exploded side view including a partial cross section of power semiconductor device 1 in which power module part 11 and heat sink 51 have not yet been integrated by a crimping process. FIG. 42 illustrates a side view including a partial cross section of power semiconductor device 1 in which power module part 11 and heat sink 51 have been integrated by a crimping process.

As illustrated in FIGS. 41 and 42, heat sink base part 53 in power semiconductor device 1 includes heat radiation diffusion part 53*a* and a raised part 53*b*. Raised part 53*b* is formed to project from heat radiation diffusion part 53*a* toward power module part 11 side. It is to be noted that the other components are similar to the components of power semiconductor device 1 illustrated in FIG. 1 or the like. Thus, the same members are denoted by the same reference numerals and the description thereof will not be repeated unless necessary.

Power semiconductor device 1 described above offers the following effect in addition to the effect of increasing productivity brought about by forming buffer recess 15*c* described above. Raised part 53*b* is formed to project from heat radiation diffusion part 53*a* toward power module part 11 side in power semiconductor device 1. This makes it possible to secure insulation distance L between lead frame 23 and heat radiation diffusion part 53*a* of heat sink base part 53 as illustrated in FIG. 42. Lead frame 23 projects from mold resin 29 in power module part 11.

Heat sink base part 53 is manufactured by a cutting process, a forging process, an extruding process, or a die casting process. Raised part 53*b* is formed at the same time when heat sink base part 53 is manufactured. This makes it possible to set the thickness (height) of raised part 53*b* freely and secure necessary insulation distance L corresponding to the specifications easily without reducing productivity.

Figure 43:
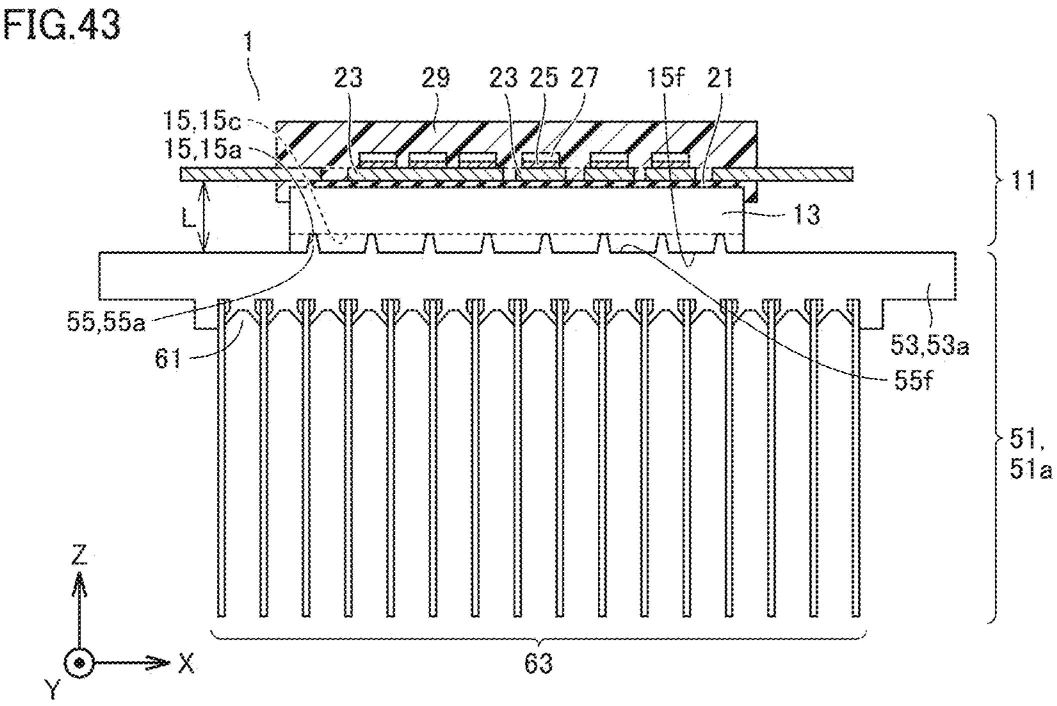
FIG. 43 is a side view illustrating another example in which the power module part and the heat sink are integrated in the second embodiment, the side view including a partial cross section.

It is to be noted that a structure in which module base 13 grows in thickness as illustrated in FIG. 43 is also conceivable as a technique of securing insulation distance L between lead frame 23 and heat radiation diffusion part 53*a*. In this case, as module base 13 grows thicker, module base 13 generates a larger amount of heat. It is therefore desirable to secure insulation distance L by forming raised part 53*b* on heat radiation diffusion part 53*a* in consideration of productivity for molding mold resin 29.

Third Embodiment

Here, a power conversion device to which power semiconductor device 1 described in the first embodiment or the second embodiment described above is applied will be described. The present disclosure is not limited to any specific power conversion device, but the following describes a case where the present disclosure is applied to a three-phase inverter as a third embodiment.

Figure 44:
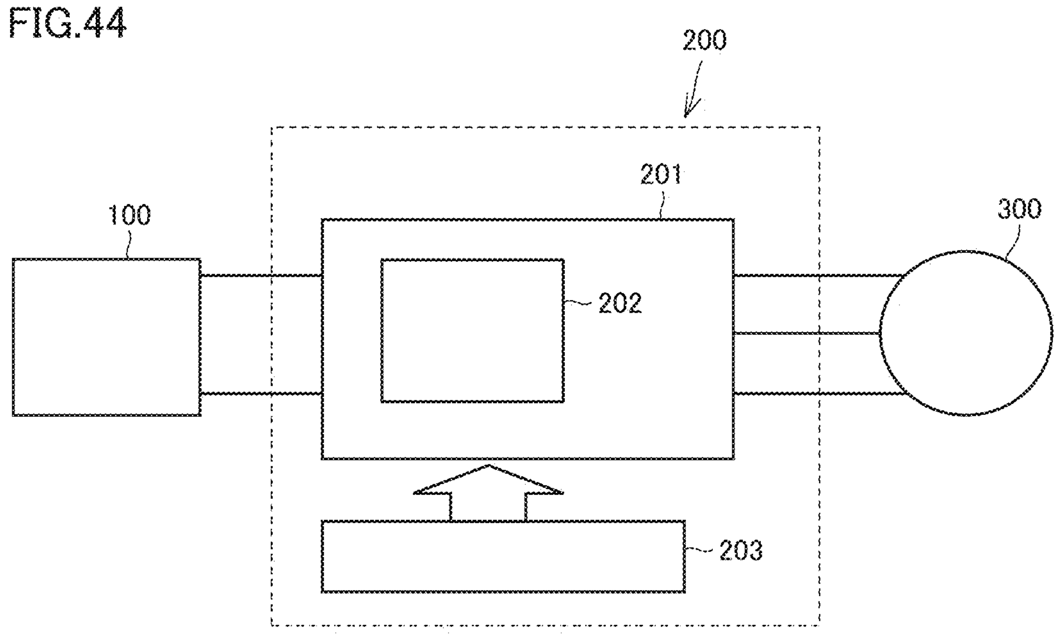
FIG. 44 is a block diagram of a power conversion device according to a third embodiment to which a power semiconductor device is applied.

FIG. 44 is a block diagram illustrating a configuration of a power conversion system to which a power conversion device according to the present embodiment is applied. The power conversion system illustrated in FIG. 44 includes a power supply 100, a power conversion device 200, and a load 300. Power supply 100 is a direct-current power supply. Power supply 100 supplies power conversion device 200 with direct-current power. Power supply 100 can include a variety of components. For example, power supply 100 can include a direct-current system, a solar cell, and a rechargeable battery. In addition, a rectifier circuit or an AC/DC converter connected to an alternating-current system may be included. In addition, power supply 100 may include a DC/DC converter that converts direct-current power output from the direct-current system to predetermined power.

Power conversion device 200 is a three-phase inverter connected between power supply 100 and load 300. Power conversion device 200 converts direct-current power supplied from power supply 100 to alternating-current power and supplies load 300 with the alternating-current power. As illustrated in FIG. 44, power conversion device 200 includes a main conversion circuit 201 and a control circuit 203. Main conversion circuit 201 converts direct-current power to alternating-current power and outputs the alternating-current power. Control circuit 203 outputs a control signal to main conversion circuit 201. The control signal is for controlling main conversion circuit 201.

Load 300 is a three-phase electric motor that is driven by alternating-current power supplied from power conversion device 200. It is to be noted that load 300 is not limited to any specific use. Load 300 includes electric motors that are mounted on a variety of electrical devices. For example, load 300 is used as an electric motor for a hybrid automobile, an electric automobile, a railroad vehicle, an elevator, or an air conditioner.

The following describes details of power conversion device 200. Main conversion circuit 201 includes a switching element and a freewheeling diode (any of which is not illustrated). The switching of the switching element converts direct-current power supplied from power supply 100 to alternating-current power and supplies the alternating-current power to load 300. Main conversion circuit 201 has a variety of specific circuit configurations. Main conversion circuit 201 according to the present embodiment is a 2-level three-phase full-bridge circuit. Main conversion circuit 201 can include six switching elements and six freewheeling diodes in antiparallel to the respective switching elements.

At least any of each switching element and each freewheeling diode of main conversion circuit 201 includes power semiconductor device 1 according to the first embodiment or the second embodiment described above as a semiconductor module 202. The six switching elements are connected two by two in series to compose upper and lower arms. The upper and lower arms configure the respective phases (U phase, V phase, and W phase) of the full-bridge circuit. Output terminals of the respective upper and lower arms are connected to load 300. In other words, three output terminals of main conversion circuit 201 are connected to load 300.

In addition, main conversion circuit 201 includes a drive circuit (not illustrated) that drives each of the switching elements. The drive circuit may be incorporated in semiconductor module 202. Alternatively, main conversion circuit 201 may include the drive circuit separately from semiconductor module 202. The drive circuit generates a driving signal for driving a switching element of main conversion circuit 201 and supplies the driving signal to a control electrode of the switching element of main conversion circuit 201. Specifically, a driving signal for turning on a switching element and a driving signal for turning off a switching element are output to the control electrode of each switching element in accordance with a control signal from control circuit 203 described below. When a switching element is kept on, the driving signal is a voltage signal (ON signal) that is a threshold voltage of the switching element or more. When a switching element is kept off, the driving signal is a voltage signal (OFF signal) that is the threshold voltage of the switching element or less.

Control circuit 203 controls a switching element of main conversion circuit 201 to supply load 300 with desired power. Specifically, time (ON time) for which each switching element of main conversion circuit 201 is to be on is calculated on the basis of power to be supplied to load 300. For example, it is possible to control main conversion circuit 201 by using PWM control. The ON time of a switching element is modulated in accordance with a voltage to be output under the PWM control. A control command (control signal) is then output to the drive circuit included in main conversion circuit 201 to output an ON signal to a switching element to be turned on at each time and output an OFF signal to a switching element to be turned off at each time. The drive circuit outputs an ON signal or an OFF signal to the control electrode of each switching element as a driving signal in accordance with this control signal.

In the power conversion device according to the present embodiment, power semiconductor device 1 described in the first embodiment or the second embodiment is applied to at least any of each switching element and each freewheeling diode of main conversion circuit 201 as semiconductor module 202. This makes it possible to contribute to an increase in the productivity of the power conversion device.

In the present embodiment, the example has been described in which the present disclosure is applied to a 2-level three-phase inverter, but the present disclosure is not limited to this. The present disclosure is applicable to a variety of power conversion devices. The present embodiment adopts a 2-level power conversion device, but a 3-level or multi-level power conversion device may be adopted. Alternatively, when power is supplied to a single-phase load, the present disclosure may be applied to a single-phase inverter. In addition, when power is supplied to a direct-current load or the like, the present disclosure is also applicable to a DC/DC converter or an AC/DC converter.

In addition, the power conversion device to which the present disclosure is applied is not limited to an electric motor serving as the load described above. For example, the power conversion device is also usable as a power supply device of an electric discharge machine, a laser beam machine, an induction heating cooker, or a contactless power supply system. Further, the power conversion device is also usable as a power conditioner of a photovoltaic power generation system, a power storage system, or the like.

It is to be noted that the power semiconductor devices described in the respective embodiments may be combined in a variety of ways as necessary.

The embodiments disclosed herein are example, but not limitative. The present disclosure is defined not by the scope described above, but by the claims. The present disclosure is intended to include all modifications within the meaning and the scope equivalent to the claims.

INDUSTRIAL APPLICABILITY

The present disclosure is effectively used for a heat-sink-integrated power semiconductor device in which a power module and a heat sink are integrated.

REFERENCE SIGNS LIST

1 power semiconductor device
11 power module part
13 module base
15 uneven part
15*a*, 15*b* recess
15*c*, 15*d* buffer recess
15*f* flat part
16 dotted circle
17 uneven part
17*a*, 17*b* protrusion
17*c* buffer recess
17*f* flat part
21 insulating sheet
23 lead frame
25 solder
27 chip
29 mold resin
51, 51*a*, 51*b*, 51*c* heat sink
53 heat sink base part
53*a* heat radiation diffusion part
53*b* raised part
55 uneven part
55*a*, 55*b* protrusion
55*f* flat part
57 uneven part
57*a*. 57*b* recess
57*c* buffer recess
57*f* flat part
61 crimp part
63 heat radiator fin
65 load reception part
71 press blade
73 heat sink setting jig

The invention claimed is:

1. A power semiconductor device comprising:

a power module part including a module base on which a first uneven part is formed, the module base being equipped with a power semiconductor element, the power semiconductor element being sealed with a sealant;

a heat sink base part on which a second uneven part is formed, the heat sink base part being joined to the module base in a manner in which the second uneven part and the first uneven part are fitted together; and a plurality of heat radiator fins that is attached to the heat sink base part, wherein on the module base and the heat sink base part, the first uneven part and the second uneven part have a portion at which the first uneven part and the second uneven part are fitted together, the portion extending in a first direction, the first uneven part includes a buffer recess that is left as a space with the module base and the heat sink base part joined together, the first uneven part is formed on a surface of the module base, the surface being the other surface opposite to one surface of the module base on which the power semiconductor element is mounted, and the buffer recess is formed in a flat part of the other surface toward the one surface, and formed to extend in a second direction that crosses the first direction.

2. The power semiconductor device according to claim 1, wherein the heat sink base part includes a heat radiation diffusion part to which a plurality of the heat radiator fins are attached, and the second uneven part is formed on the heat radiation diffusion part.

3. The power semiconductor device according to claim 1, wherein the heat sink base part includes a heat radiation diffusion part to which a plurality of the heat radiator fins are attached, and a raised part that is raised from the heat radiation diffusion part toward a side on which the power module part is positioned, and the second uneven part is formed on the raised part.

4. The power semiconductor device according to claim 1, wherein any of the first uneven part and the second uneven part is provided with a discontinuous portion.

5. The power semiconductor device according to claim 1, wherein a plurality of the heat radiator fins are attached to a region other than a region positioned on an outer peripheral part of the heat sink base part.

6. A power conversion device comprising:

a main conversion circuit including the power semiconductor device according to claim 1, the main conversion circuit converting and outputting received power; and a control circuit that outputs a control signal to the main conversion circuit, the control signal being for controlling the main conversion circuit.

7. A power semiconductor device comprising:

a power module part including a module base on which a first uneven part is formed, the module base being equipped with a power semiconductor element, the power semiconductor element being sealed with a sealant;

a heat sink base part on which a second uneven part is formed, the heat sink base part being joined to the module base in a manner in which the second uneven part and the first uneven part are fitted together; and a plurality of heat radiator fins that is attached to the heat sink base part, wherein on the module base and the heat sink base part, the first uneven part and the second uneven part have a portion at which the first uneven part and the second uneven part are fitted together, the portion extending in a first direction, the second uneven part includes a buffer recess that is left as a space with the module base and the heat sink base part joined together, and the buffer recess is formed in a flat part of the heat sink base part toward a side opposite to a side to which the module base is joined, and formed to extend in a second direction that crosses the first direction.

8. The power semiconductor device according to claim 7, wherein the heat sink base part includes a heat radiation diffusion part to which a plurality of the heat radiator fins are attached, and the second uneven part is formed on the heat radiation diffusion part.

9. The power semiconductor device according to claim 7, wherein the heat sink base part includes a heat radiation diffusion part to which a plurality of the heat radiator fins are attached, and a raised part that is raised from the heat radiation diffusion part toward a side on which the power module part is positioned, and the second uneven part is formed on the raised part.

10. The power semiconductor device according to claim 7, wherein any of the first uneven part and the second uneven part is provided with a discontinuous portion.

11. The power semiconductor device according to claim 7, wherein a plurality of the heat radiator fins are attached to a region other than a region positioned on an outer peripheral part of the heat sink base part.

12. A power conversion device comprising:

a main conversion circuit including the power semiconductor device according to claim 7, the main conversion circuit converting and outputting received power; and a control circuit that outputs a control signal to the main conversion circuit, the control signal being for controlling the main conversion circuit.

13. A method for manufacturing a power semiconductor device, the method comprising:

preparing a module base on which a first uneven part is formed;

forming a power module part by mounting a power semiconductor element on the module base and sealing the power semiconductor element with a sealant in a manner in which the first uneven part is exposed;

preparing a heat sink base part on which a second uneven part is formed, the second uneven part being fitted into the first uneven part; and integrating the module base and the heat sink base part by opposing the first uneven part and the second uneven part to each other and pressing one of the module base in the power module part and the heat sink base part to another of the module base in the power module part and the heat sink base part, wherein in the preparing the module base and the preparing the heat sink base part, the first uneven part and the second uneven part are formed to have a portion at which the first uneven part and the second uneven part are fitted together, the portion extending in a first direction, and in the preparing the module base, the first uneven part is formed on a surface of the module base, the surface being the other surface opposite to one surface of the module base on which the power semiconductor element is mounted, the first uneven part is formed to include a buffer recess that is left as a space with the module base and the heat sink base part joined together, and the buffer recess is formed in a flat part of the other surface toward the one surface, and formed to extend in a second direction that crosses the first direction.

14. The method for manufacturing the power semiconductor device according to claim 13, wherein the preparing the heat sink base part includes preparing the heat sink base part on which a heat radiator fin insertion groove in which a plurality of heat radiator fins is each inserted and a crimp part are formed on an opposite side to a side to which the power module part is joined, the crimp part crimping the heat radiator fin inserted in the heat radiator fin insertion groove, and the joining the module base and the heat sink base part includes opposing the first uneven part and the second uneven part to each other and disposing each of a plurality of the heat radiator fins in the corresponding heat radiator fin insertion groove, and integrating the module base, the heat sink base part, and a plurality of the heat radiator fins by fitting the first uneven part and the second uneven part together by bringing a crimping jig into contact with the crimp part and pressing the heat sink base part to the module base and attaching a plurality of the heat radiator fins to the heat sink base part by crimping the crimp part.

15. The method for manufacturing the power semiconductor device according to claim 13, wherein the preparing the heat sink base part includes preparing the heat sink base part on which a plurality of heat radiator fins is integrally disposed on an opposite side to a side to which the power module part is joined, and the joining the module base and the heat sink base part includes disposing the heat sink base part on a heat sink setting jig, disposing the power module part to oppose the first uneven part to the second uneven part of the heat sink base part disposed on the heat sink setting jig, and fitting the first uneven part and the second uneven part together by pressing the power module part to the heat sink base part.

16. A method for manufacturing a power semiconductor device, the method comprising:

preparing a module base on which a first uneven part is formed;

forming a power module part by mounting a power semiconductor element on the module base and sealing the power semiconductor element with a sealant in a manner in which the first uneven part is exposed;

preparing a heat sink base part on which a second uneven part is formed, the second uneven part being fitted into the first uneven part; and integrating the module base and the heat sink base part by opposing the first uneven part and the second uneven part to each other and pressing one of the module base in the power module part and the heat sink base part to another of the module base in the power module part and the heat sink base part, wherein in the preparing the module base and the preparing the heat sink base part, the first uneven part and the second uneven part are formed to have a portion at which the first uneven part and the second uneven part are fitted together, the portion extending in a first direction, and in the preparing the heat sink base part, the second uneven part is formed to include a buffer recess that is left as a space with the module base and the heat sink base part joined together, and the buffer recess is formed in a flat part of the heat sink base part toward a side opposite to a side to which the module base is joined, and formed to extend in a second direction that crosses the first direction.

17. The method for manufacturing the power semiconductor device according to claim 16, wherein the preparing the heat sink base part includes preparing the heat sink base part on which a heat radiator fin insertion groove in which a plurality of heat radiator fins is each inserted and a crimp part are formed on an opposite side to a side to which the power module part is joined, the crimp part crimping the heat radiator fin inserted in the heat radiator fin insertion groove, and the joining the module base and the heat sink base part includes opposing the first uneven part and the second uneven part to each other and disposing each of a plurality of the heat radiator fins in the corresponding heat radiator fin insertion groove, and integrating the module base, the heat sink base part, and a plurality of the heat radiator fins by fitting the first uneven part and the second uneven part together by bringing a crimping jig into contact with the crimp part and pressing the heat sink base part to the module base and attaching a plurality of the heat radiator fins to the heat sink base part by crimping the crimp part.

18. The method for manufacturing the power semiconductor device according to claim 16, wherein the preparing the heat sink base part includes preparing the heat sink base part on which a plurality of heat radiator fins is integrally disposed on an opposite side to a side to which the power module part is joined, and the joining the module base and the heat sink base part includes disposing the heat sink base part on a heat sink setting jig, disposing the power module part to oppose the first uneven part to the second uneven part of the heat sink base part disposed on the heat sink setting jig, and fitting the first uneven part and the second uneven part together by pressing the power module part to the heat sink base part.

* * * * *